United States Patent [19]
Sekiguchi et al.

[11] Patent Number: 6,087,823
[45] Date of Patent: Jul. 11, 2000

[54] ELECTRONIC INDUCTANCE CIRCUIT

[75] Inventors: Masaru Sekiguchi; Takashi Taya; Masao Kamio; Shigeo Abe, all of Tokyo, Japan

[73] Assignee: Oki Electric Industry Co., Ltd., Tokyo, Japan

[21] Appl. No.: 09/321,230

[22] Filed: May 27, 1999

[30] Foreign Application Priority Data

May 29, 1998 [JP] Japan .................................. 149266/98

[51] Int. Cl.$^7$ ...................................................... H03H 1/00
[52] U.S. Cl. ........................ 323/364; 323/370; 323/369; 323/351
[58] Field of Search .................................... 323/364, 369, 323/370, 351, 352, 265; 363/74

[56] References Cited

U.S. PATENT DOCUMENTS 4,677,669  6/1987  Kawami et al. ......................... 379/413

OTHER PUBLICATIONS

Usuda et al., A Study on Subscriber Line Interface Circuit for Digital Local Switching System, Shingaku Gihou Se79–107, pp. 79–86.

*Primary Examiner*—Edward H. Tso
*Assistant Examiner*—Gary L Laxton
*Attorney, Agent, or Firm*—Venable

[57] ABSTRACT

There is provided an electronic inductance circuit having a transistor, a first resistor, a second resistor, a capacitor and a first current source. The main current path of the transistor and the first resistor are connected in series to form a first serial circuit between an input terminal and an output terminal. The second resistor and the capacitor are connected in series to form a second serial circuit between the input and output terminals, thus forming a parallel circuit of the first and second serial circuits. The connection point between the second resistor and the capacitor is coupled to the control terminal of the transistor. The connection point is connected to the first current source for determining the operating point of the transistor.

16 Claims, 15 Drawing Sheets

40: ELECTRONIC INDUCTANCE CIRCUIT

10: ELECTRONIC INDUCTANCE CIRCUIT

PRIOR ART

PRIOR ART

ELECTRONIC INDUCTANCE CIRCUIT

BACKGROUND OF THE INVENTION

1. Field of the Invention

The present invention relates to an electronic inductance circuit suitable for use with a current supply circuit for supplying speech (or channel) current to a subscriber terminal of a subscriber circuit.

2. Description of Related Art

Subscriber circuits for electronic switching apparatus are formed with many circuit elements mounted on a semiconductor substrate according to demands such as smaller size and lower power consumption. Electronic inductance circuits are used for inductance components which are an essential structural element of subscriber circuits. When an electronic inductance circuit is used, coils become unnecessary, so smaller size can be realized. An example of a conventional electronic inductance circuit is disclosed in the reference "SHINGAKU GIHOU SE79-107, pp. 79–86".

FIG. 13 is a circuit diagram showing an equivalent circuit of the electronic inductance circuit noted in the above-mentioned reference. This electronic inductance circuit is used in a speech current supply circuit within a subscriber circuit, and has a dual circuit structure. When this electronic inductance circuit is used as a single circuit structure, the electronic inductance circuit can be represented as shown in FIG. 14. Here, we will omit an explanation of the circuit itself shown in FIG. 13.

The electronic inductance circuit 10 shown in FIG. 14 comprises an NPN transistor Tr1, resistors 12, 14, and 16, and capacitor 18. FIG. 14 also shows terminal A1 as an input terminal and terminal A0 as an output terminal. Between these two terminals A1 and A0, the main current path between the collector terminal and the emitter terminal of NPN transistor Tr1 and the resistor 16 are connected in series from the terminal A1 side. Also, between the two terminals A1 and A0, the resistors 14 and 12 are connected in series from the terminal A1 side. These resistors 14 and 12 are provided in parallel in relation to the transistor Tr1 and the resistor 16. Also, a connection point 20 between the resistors 14 and 12 is connected to the base terminal of the transistor Tr1. Furthermore, the capacitor 18 is connected in parallel to the resistor 12.

This type of electronic inductance circuit 10 for speech current supply circuits allows direct current to pass on the one hand, while also suppressing alternating current components.

First, we will explain the operation of allowing direct current, or speech current, to pass. A speech current IL flows within the electronic inductance circuit 10 in the sequence of the terminal A1, the main current path of the NPN transistor Tr1, the resistor 16, and the terminal A0. Here, a terminal A1 direct current operating point (specifically, a voltage drop of V10 between the terminals A1 and A0) is needed. This voltage drop V10 is the sum of the voltage drop at the resistor 14, the voltage drop VBE between the base terminal and the emitter terminal of the transistor Tr1, and the voltage drop at the resistor 16, as represented by equation (1). Note that the current amplification factor hfe of the transistor Tr1 is sufficiently high, so the base current can be ignored, and a current of equal size flows to both the resistors 14 and 12.

$$V10 = R1 \times (R2 \times IL + VBE)/R0 + R2 \times IL + VBE \quad (1)$$

Signals R0, R1, and R2 represent the resistance values of the resistors 12, 14, and 16, respectively.

Next, we will explain the alternating current impedance of electronic inductance circuit 10. Generally, the resistance values R1 and R0 of the resistors 14 and 12 which are provided in a location that is not in the path of speech current IL are sufficiently large in comparison to the resistance value R2 of the resistor 16. In fact, the current amplification factor hfe of the transistor Tr1 is sufficiently high, so it is possible to ignore the alternating current that flows to the resistor 14. Therefore, the alternating current impedance R10 between the terminals A1 and A0 is represented by equation (2).

$$R10 = j\omega\{(1/gm + R2) \times C1 \times R1\} + (1/gm + R2) \times (R1/R0 + 1) \quad (2)$$

Furthermore, the signal C1 and gm represent the capacity of the capacitor 18 and the conductance of the transistor Tr1, respectively. Also, $$j = \sqrt{-1}$$

and the signal $\omega$ represents the alternating current angular frequency.

When electronic inductance circuit 10 allows direct current to pass, it is preferable to have the voltage drop V10 represented by equation (1) be small. On the other hand, to have alternating current components suppressed, each parameter value is determined such that the alternating current impedance R10 represented by equation (2) will be suitable.

Furthermore, the electronic inductance circuit 10 shown in FIG. 14 uses an NPN transistor, but it is also acceptable to construct the circuit using a PNP transistor. FIG. 15 is a circuit diagram showing the structure of a conventional electronic inductance circuit constructed using a PNP transistor.

The electronic inductance circuit 10a shown in FIG. 15 comprises a PNP transistor Tr2 resistors 12, 14, and 6, and a capacitor 18. Also, terminal A1 is shown as an input terminal and terminal A0 is shown as an output terminal in FIG. 15. Between these two terminals A1 and A0, a main current path between the collector terminal and the emitter terminal of the PNP transistor Tr2 and the resistor 16 are connected in series from the terminal A0 side. Also, between the terminals A1 and A0, the resistors 14 and 12 are connected in series from the terminal A0 side. These resistors 14 and 12 are provided in parallel in relation to the transistor Tr2 and the resistor 16. Also, the connection point 20 between these resistors 14 and 12 is connected to the base terminal of the transistor Tr2. Furthermore, the capacitor 18 is connected in parallel to the resistor 12.

In this way, the circuit shown in FIG. 15 is symmetrical with the circuit shown in FIG. 14. Even with the circuit shown in FIG. 15, the voltage drop and alternating current impedance between the terminals A1 and A0 are represented by the equations (1) and (2) described above, respectively.

However, the electronic inductance circuit 10 (10a) shown in FIGS. 14 and 15 has the problems noted below.

(a) The voltage drop V10 between the terminals A1 and A0 of the electronic inductance circuit 10 (10a) is represented by the above equation (1). The voltage drop V10 is affected by fluctuations in the current value of the direct current IL and by fluctuations in the voltage drop VBE between the base terminal and the emitter terminal of the transistor Tr1 (Tr2). This voltage drop VBE between the base terminal and the emitter terminal fluctuates according to temperature fluctuations. Therefore, to correctly operate the electronic inductance circuit 10 and to avoid distortion of the output signal of the transistor Tr1 in relation to the input alternating current signal, it is necessary to take into consideration fluctuations in direct current and fluctuations in temperature. To do this, the voltage drop between the terminals A1 and A0 must be made sufficiently large. However, this means the power consumption of the electronic inductance circuit 10 becomes large.

(b) When the electronic inductance circuit 10 is used for a subscriber circuit, there are times when one does not wish to implement the alternating current component suppression function. In this case, as shown in FIG. 16, a switch SW1 is connected in parallel to the electronic inductance circuit 10. When one does not wish to implement the alternating current component suppression function, this switch SW1 is connected. In this way, since it is necessary to provide the switch SW1, the number of parts to be used in the conventional electronic inductance circuit increases, and the circuit scale thereof increases as well.

(c) When the electronic inductance circuit 10 is used for a subscriber circuit, the alternating current signals input to the electronic inductance circuit 10 have their various amplitudes such as howler tones and busy-back tones. Then, the amplitude of the output signals of the electronic inductance circuit 10 differ for each type of these input signals. In this kind of use environment, depending on the type of input signal, it may be necessary to change the operating range of the electronic inductance circuit 10 (the largest alternating current amplitude that can be handled). To do this, the resistance value R0 of the resistor 12 shown in FIG. 14 must be changed. However, when the electronic inductance circuit 10 is fabricated on a semiconductor substrate, it is difficult to use a variable resistor for the resistor 12.

(d) Also, there are cases when an alternating current signal is input to a circuit using the electronic inductance circuit 10, and this alternating current signal is superimposed on a signal based on the direct current IL. As with the conventional example shown in FIG. 17, the alternating current signal generated at the alternating current signal generating source 22 is input to the electronic inductance circuit 10 via an alternating current signal superimposing circuit 24. Because the alternating current signals are superimposed in this way, there is an increase in the number of parts to be used in the conventional electronic inductance circuit and circuit scale thereof.

(e) Also, when the frequency of the alternating current signal superimposed in the electronic inductance circuit 10 becomes high, it becomes impossible for the transistor Tr1 that constructs the electronic inductance circuit 10 to keep up with this, and the circuit alternating current impedance decreases. When the alternating current impedance is low, there is an effect on the impedance of the end terminal of the subscriber circuit.

(f) Also, when the electronic inductance circuit 10 is used for a subscriber circuit, there are times when a user may wish to monitor the supply current to a subscriber terminal. In this case, as shown in FIG. 18, a resistor RE is connected in series to the electronic inductance circuit 10, and a current monitor circuit 26 is connected in parallel to this resistor RE. Thus, the number of parts to be used in the conventional electronic inductance circuit increases, and the power consumption of the circuit increases due to a voltage drop at the resistor RE.

(g) Also, when the electronic inductance circuit 10 is used for a subscriber circuit, it becomes necessary to block the speech current IL. To do this, as shown in FIG. 19, a cutoff switch SW2 is connected in series to the electronic inductance circuit 10. However, this causes the parts count and circuit scale to increase. Furthermore, when the switch SW2 is composed from a thyristor or transistor, a voltage drop occurs in that part, and power consumption increases.

SUMMARY OF THE INVENTION

Thus, an object of the present invention is to provide an electronic inductance circuit with low power consumption.

Another object of the present invention is to provide an electronic inductance circuit that can realize a reduction in the parts count and circuit scale.

Another object of the present invention is to provide an electronic inductance circuit for which it is easy to change the operating range.

Yet another object of the present invention is to provide an electronic inductance circuit for which the alternating current impedance is large.

To achieve these objects, the electronic inductance circuit of the present invention comprises the unique structure described below. Specifically, the electronic inductance circuit of the present invention comprises a transistor, a first resistor, a second resistor, a capacitor, and a first current source. Also, with the present invention, there is a first serial circuit connected between the input terminal and the output terminal and formed from a series circuit of the main current path of the transistor and the first resistor. Also, with the present invention, there is a second serial circuit connected between the input terminal and the output terminal and formed from a series circuit of the second resistor and the capacitor. Furthermore, with the present invention, this second serial circuit is provided in parallel to the first serial circuit. Furthermore, with the present invention, the connection point between the second resistor and the capacitor is coupled to the control terminal of the transistor. Also, with the present invention, the connection point is connected to a first current source for determining the operating point of the transistor.

In terms of embodiments of the present invention, it is preferable to provide a filter coupled between the connection point and the control terminal of the transistor.

With a preferred embodiment of the present invention, it is desirable for the filter be connected in parallel with a resistor and a capacitor.

In terms of embodiments of the present invention, it is preferable to have the connection point directly connected to the control terminal of the transistor.

Also, with a preferred embodiment of the present invention, the transistor may be an NPN transistor, and the first serial circuit may be connected from the input terminal side in the sequence of the main current path of the transistor and the first resistor, while the second serial circuit may be connected from the input terminal side in the sequence of the second resistor and the capacitor.

Also, with another preferred embodiment of the present invention, the transistor may be a PNP transistor, and the first serial circuit may be connected from the input terminal side in the sequence of the first resistor and the main current path of the transistor, while the second serial circuit may be connected from the input terminal side in the sequence of the capacitor and the second resistor.

With yet another preferred embodiment of the present invention, it is desirable to have the first current source generate current of a value that corresponds to an operating range control signal input from outside, and to have it control the voltage drop of the main current path of the transistor.

With yet another preferred embodiment of the present invention, it is desirable to have a second current source connected to the control terminal of the transistor, and to have this second current source generate current of a value that saturates the transistor in correspondence to stop control signals that are input from outside.

With yet another preferred embodiment of the present invention, it is desirable to have the connection point of the transistor control terminal and the filter be an input unit on which a current is applied that is based on an alternating current signal superimposed on the direct current that flows to the main current path.

Also, with a preferred embodiment of the present invention, it is desirable to have a voltage/current conversion circuit connected to the input unit and an alternating current source connected to this voltage/current conversion circuit, and to have this alternating current source generate alternating voltage, while the voltage/current conversion circuit converts alternating voltage to current.

With yet another preferred embodiment of the present invention, it is desirable to have a current monitor circuit that is connected to both ends of the first resistor and that detects direct current flowing to the concerned first resistor.

With yet another preferred embodiment of the present invention, it is desirable to have a switch that is connected in series to the second resistor and that performs switching operation according to an on/off control signal from outside.

With yet another preferred embodiment of the present invention, it is desirable to have a choke coil that is connected in series to the input terminal.

Also, another electronic inductance circuit of the present invention comprises an input terminal, an output terminal, a first inductance circuit unit, a second inductance circuit unit, a current supply circuit, a current source group, and an alternating current power supply unit. With the present invention, the output terminal and the current supply circuit are connected by an output line via the first inductance circuit unit, and the input terminal and the current supply circuit are connected by an input line via the second inductance circuit unit. Also, with the present invention, the current supply circuit supplies speech current through the first inductance circuit unit to the subscriber terminal that is connected between the input terminal and the output terminal, while also inputting through the second inductance circuit a speech current that flows out from the subscriber terminal. Also, with the present invention, each of the first and second inductance circuit units comprises a first transistor, a first resistor, a second resistor, a capacitor, and a filter. Furthermore, with the present invention, there is a first serial circuit constructed from a main current path of the first transistor and the first resistor that are connected in series between the subscriber terminal and the current supply circuit. Also, with the present invention, there is a second serial circuit constructed from the second resistor and the capacitor that are connected in series between the subscriber terminal and the current supply circuit. Also, with the present invention, this second serial circuit is provided in parallel to the first serial circuit. Also, with the present invention, the connection point between the second resistor and the capacitor is connected via the filter to the control terminal of the first transistor. Furthermore, with the present invention, the current source group comprises a first current source connected to the connection point and a second current source connected to the control terminal of the first transistor. Furthermore, with the present invention, the first current source generates a current for determining the operating point of the first transistor. Also, with the present invention, the second current source generates a current of a value that saturates the first transistor according to the stop control signal input from outside. Also, with the present invention, the alternating current power supply unit comprises a voltage/current conversion circuit connected to the connection point of the first transistor control terminal and the filter, and an alternating current power supply connected to this voltage/current conversion circuit, this alternating current power supply generates alternating voltage, and the voltage/current conversion circuit converts this alternating voltage to current.

For an embodiment of the present invention, it is preferable that the first current source generate current of a value corresponding to operating range control signals input from outside, and it is desirable that it control the voltage drop across the main current path of the first transistor.

With a preferred embodiment of the present invention, it is desirable that the second current source connected to a control terminal of the first transistor constructing the first inductance circuit unit comprises a second transistor which has a main current path connected between the concerned control terminal and an output line and a third resistor connected between the control terminal of this second transistor and an output line.

Also, it is desirable that the second current source connected to the control terminal of the first transistor that constructs the second inductance circuit unit comprise a third transistor that has a main current path connected between the concerned control terminal and an input line and a fourth resistor connected between this third transistor control terminal and an input line.

BRIEF DESCRIPTION OF THE DRAWINGS

The following and other objects, features and advantages of the present invention will be better understood from the following description taken in connection with accompanying drawings, in which.

DESCRIPTION OF THE PREFERRED EMBODIMENTS

With reference to drawings, a detailed description will hereinafter be given to the embodiments of the electronic inductance circuit of the present invention. In the Figures, the structural elements are schematically shown in order to make the invention easier to understand.

First Embodiment

Figure 1A:
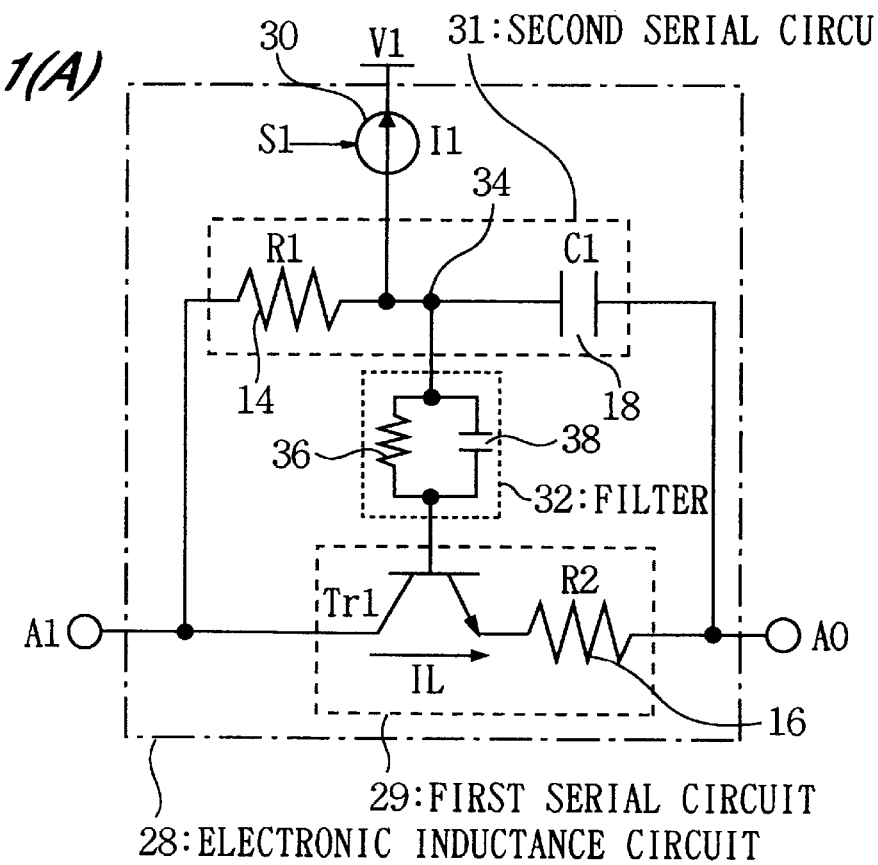
FIG. 1 (including FIGS. 1A and 1B) is a circuit diagram showing the structure of an electronic inductance circuit of a first embodiment using an NPN transistor.
Figure 1B:
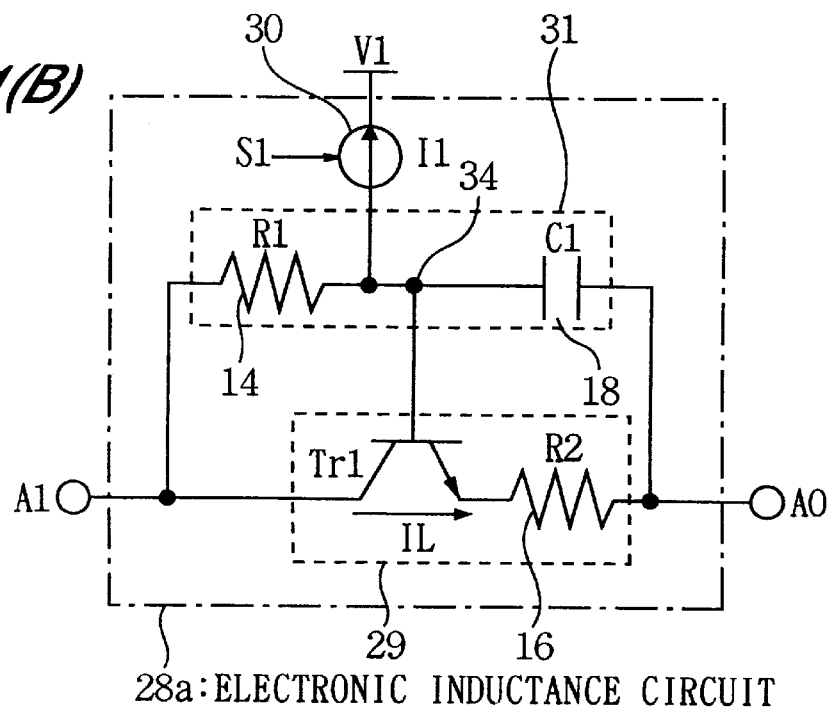

FIGS. 1A and 1B are circuit diagrams that show the structures of an electronic inductance circuit of a first embodiment. The electronic inductance circuit 28 shown in FIG. 1A comprises an NPN transistor Tr1, resistors 14 and 16, a capacitor 18, a current source (constant current source) 30, and a filter 32.

FIG. 1A shows terminal A1 as an input terminal and terminal A0 as an output terminal. Between these terminals A1 and A0, a main current path between the collector terminal that is the first main electrode terminal of NPN transistor Tr1 and the emitter terminal that is the second main electrode terminal is connected in series with a resistor 16 as a first resistor from the terminal A1 side. A first serial circuit 29 is constructed from the main current path of the transistor Tr1 and the resistor 16. The collector terminal of the transistor Tr1 is connected to terminal A1, and the emitter terminal of the transistor Tr1 is connected to one end of the resistor 16.

Between the terminals A1 and A0, the resistor 14 as a second resistor and the capacitor 18 are connected in series from the terminal A1 side. A second serial circuit 31 constructed from this resistor 14 and capacitor 18 is connected in parallel to the first serial circuit 29 constructed from the transistor Tr1 and the resistor 16.

A connection point 34 between the resistor 14 and the capacitor 18 is connected via the filter 32 to the base terminal (control terminal) of the transistor Tr1. This filter 32 is made from a resistor 36 and a capacitor 38. The resistor 36 and the capacitor 38 are both connected in parallel, with one connection point being connected to the base terminal of the transistor Tr1 and the other connection point being connected to the connection point 34 between the resistor 14 and the capacitor 18. As shown by the structure of the electronic inductance circuit 28a shown in FIG. 1B, it is acceptable not to provide this filter 32, and in this case, the connection point 34 is directly connected to the base terminal of the transistor Tr1.

For either of the structures shown in FIGS. 1A and 1B, this connection point 34 is connected to a first current source 30 for determining the operating point of the transistor Tr1 (voltage drop between the collector terminal and the emitter terminal). This current source 30 is connected to an external power supply V1, and generates a current I1. The current I1 generated by this current source 30 flows toward the external power supply V1 from the connection point 34 between the resistor 14 and the capacitor 18.

This kind of electronic inductance circuit 28 for a speech (or channel) current supply circuit allows direct current to pass while suppressing alternating current components.

First, we will explain the operation of allowing direct current, specifically speech current, to pass. The speech current IL flows within the electronic inductance circuit 28 in the sequence of the terminal A1, the main current path of the NPN transistor Tr1, the resistor 16, and the terminal A0. Here, the direct current operating point of the terminal A1 (specifically, the voltage drop V10 between the terminals A1 and A0) is required. This voltage drop V10 is the sum of the voltage drop across the resistor 14, the voltage drop VBE between the base terminal of the transistor Tr1 and emitter terminal, and the voltage drop across the resistor 16, and this is represented by equation (3). However, the current amplification factor hfe of the transistor Tr1 is sufficiently high for the base current to be ignored. The voltage drop across the filter 32 can also be ignored.

$$V10 = R1 \times I1 + VBE + R2 \times IL \quad (3)$$

Note that signals R1 and R2 represent the resistance values of resistors 14 and 16, respectively.

Next, explanation will be given to the alternating current impedance of the electronic inductance circuit 28. Generally, the resistance value R1 of the resistor 14 provided in a location that is not in the path through which a speech current IL flows is sufficiently large compared to the resistance value R2 of the resistor 16 that is provided in the speech current path IL. In fact, the current amplification factor hfe of the transistor Tr1 is sufficiently large to be able to ignore the alternating current flowing to the resistor 14. Also, the alternating current impedance of the current source 30 can be ignored because it is sufficiently large compared to the resistors 14 and 16. Therefore, the alternating current impedance R10 between the terminals A1 and A0 is represented by equation (4).

$$R10 = j\omega\{(1/gm + R2) \times C1 \times R1\} + 1/gm + R2 \quad (4)$$

Note that signals C1 and gm represent the capacity of the capacitor 18 and the conductance of the transistor Tr1, respectively. Also, $$j = \sqrt{-1},$$

and ω is the angular frequency of the alternating current.

This equation (4) correlates to when the resistance value R0 in equation (2) is infinity (∞).

In this way, the voltage drop V10 for the electronic inductance circuit 28 represented in equation (3) is small compared with the voltage drop V10 in the conventional case represented in equation (1). On the other hand, the alternating current impedance R10 of the electronic inductance circuit 28 represented in equation (4) has almost no difference from the alternating current impedance R10 in the conventional case represented in equation (2). In addition to this advantage, the electronic inductance circuit 28 of the first embodiment provides the effect described below.

Normally, the current source 30 can be created with relatively high precision. The resistor 14 can also be created with good precision. Therefore, the value of the first term (R1×I1) in equation (3) is viewed as not fluctuating. In comparison to this, the value of the second term (VBE) and the value of the third term (R2×IL) in equation (3) fluctuate according to fluctuations in the current value of the speech current IL and fluctuations in temperature. Therefore, the fluctuation components of the voltage drop V10 between the terminals A1 and A0 are represented by (VBE+R2×IL).

On the other hand, the fluctuating components in the conventional case are {R1×(R2×IL+VBE)/R0+R2×IL+VBE} represented in equation (1). Therefore, the voltage drop across the electronic inductance circuit 28 in the first embodiment has fewer fluctuating components than the conventional case. Thus, in terms of correctly operating the electronic inductance circuit 28, it is not necessary to increase the voltage drop between the terminals A1 and A0 as much as was necessary conventionally. Accordingly, lower power consumption is realized with the electronic inductance circuit 28.

Also, the current source 30 generates a current I1 of a value according to an operating range control signal S1 input from outside. With this current I1, the voltage drop volume for the main current path of the transistor Tr1 is controlled. In this way, the value of the current I1 generated by the current source 30 is constructed such that the operating range control signal S1 input from outside is input and changed. Therefore, the voltage drop between the terminals A1 and A0 can be set freely. Thus, it is possible to change the operating range (the maximum alternating current amplitude that can be handled) of the electronic inductance circuit 28 according to the type of input signal.

Also, this current source 30 can easily be incorporated in an LSI circuit. Therefore, it is possible to reduce component size.

Figure 2A:
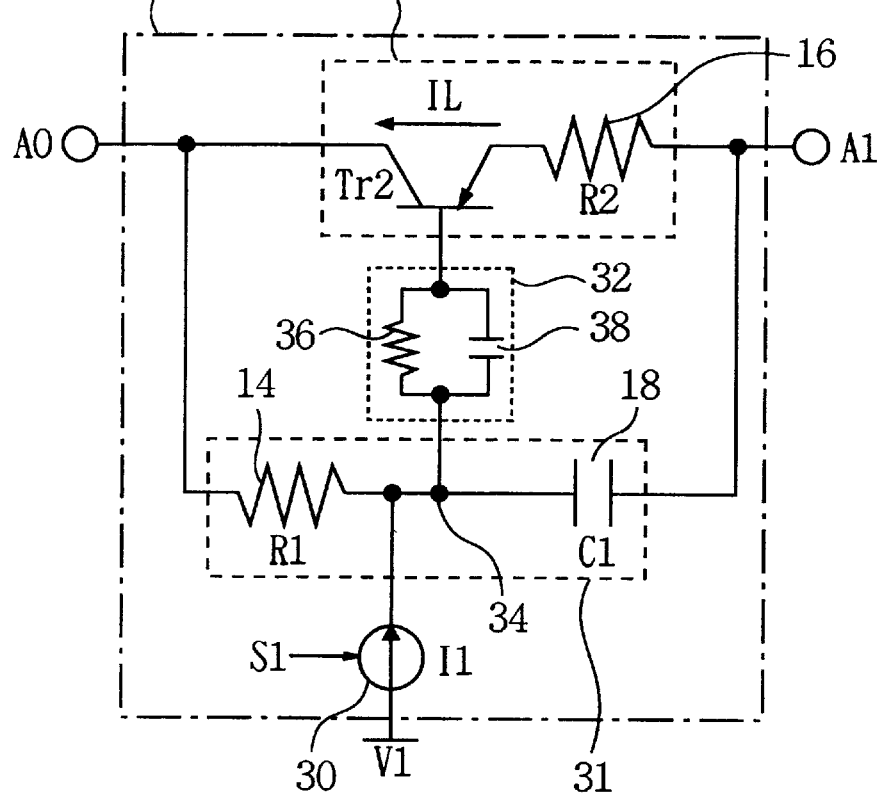
FIG. 2 (including FIGS. 2A and 2B) is a circuit diagram showing the structure of an electronic inductance circuit of a first embodiment using a PNP transistor.
Figure 2B:
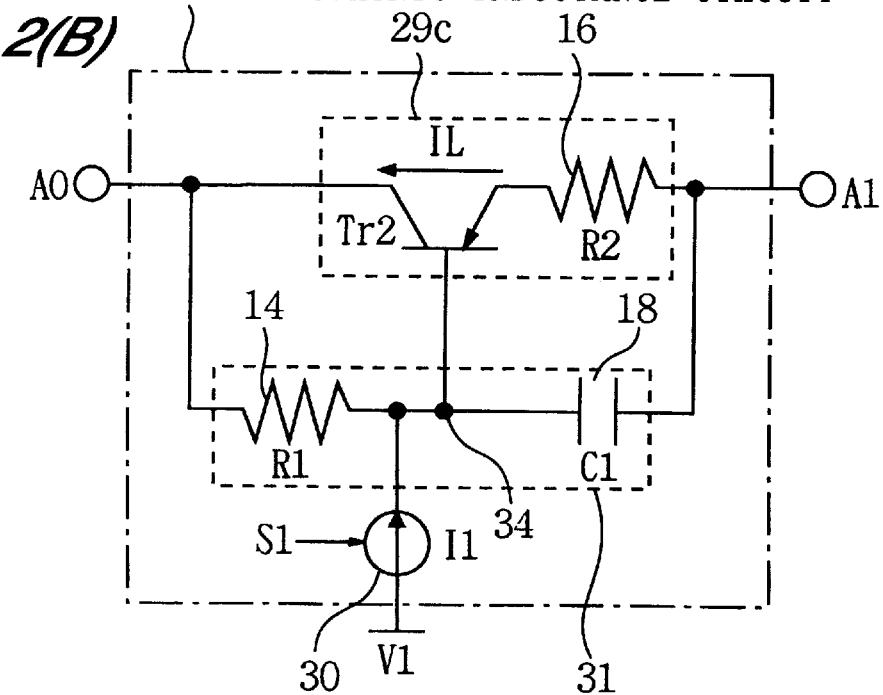

Furthermore, the electronic inductance circuits 28 and 28a shown in FIGS. 1A and 1B use NPN transistors, but it is also possible to construct them using PNP transistors. FIGS. 2A and 2B are circuit diagrams that show the structure of an electronic inductance circuit of the first embodiment structured using a PNP transistor. In FIGS. 2A and 2B, the same reference numbers and characters are used for the same structural elements as those shown in FIGS. 1A and 1B.

The electronic inductance circuit 28b shown in FIG. 2A comprises a PNP transistor Tr2 resistors 14 and 16, a capacitor 18, a current source 30, and a filter 32.

FIG. 2A shows terminal A1 as an input terminal and terminal A0 as an output terminal. Between these terminals A1 and A0, the main current path between the collector terminal and the emitter terminal of the PNP transistor Tr2 and the resistor 16 as the first resistor are connected in series from the terminal A0 side. A first serial circuit 29c is constructed from the main current path of the transistor Tr2 and the resistor 16. The collector terminal of the transistor Tr2 is connected to the terminal A0, and the emitter terminal of the transistor Tr2 is connected to one end of the resistor 16.

Between the terminals A1 and A0, the resistor 14 as the second resistor and the capacitor 18 are connected in series from the terminal A0 side. The second serial circuit 31 constructed from the resistor 14 and the capacitor 18 is connected in parallel to the first serial circuit 29c of the transistor Tr2 and the resistor 16.

The connection point 34 between the resistor 14 and the capacitor 18 is connected via the filter 32 to the base terminal of the transistor Tr2 As with the structure of the electronic inductance circuit 28c shown in FIG. 2B, this filter 32 does not have to be provided, and in that case, this connection point 34 is directly connected to the base terminal of the transistor Tr2.

For either of the circuit structures shown in FIGS. 2A and 2B, this connection point 34 is connected to the first current source 30 for determining the operating point of the transistor Tr2 This current source 30 is connected to an external power supply V1 and generates the current I1. The current I1 generated by the current source 30 flows from the external power supply V1 toward the connection point 34 between the resistor 14 and the capacitor 18.

In this way, the circuits shown in FIGS. 2A and 2B are symmetrical with the circuits shown in FIGS. 1A and 1B. With the circuits shown in FIGS. 2A and 2B as well, the voltage drop between the terminals A1 and A0 and the alternating current impedance are represented by the above-mentioned equations (3) and (4), respectively.

Following, explanation will hereinafter be given to the second through seventh embodiments in sequence, but these structural examples are basically the same as the structure of the first embodiment. Therefore, the explanation will be focused on the points that are different from the first embodiment. Also, the same reference numbers and characters used for the first embodiment are used to describe structural elements of the same name. The circuit structure in which filter 32 is not provided is omitted from its illustration.

Second Embodiment

Next, while referring to FIG. 3, explanation will be given to the electronic inductance circuit of a second embodiment. With the electronic inductance circuit of the second embodiment, using external control, it is possible to create an equivalent state to when the concerned electronic inductance circuit does not exist. Specifically, it is possible to stop the operation as an electronic inductance circuit using external control.

Figure 3:
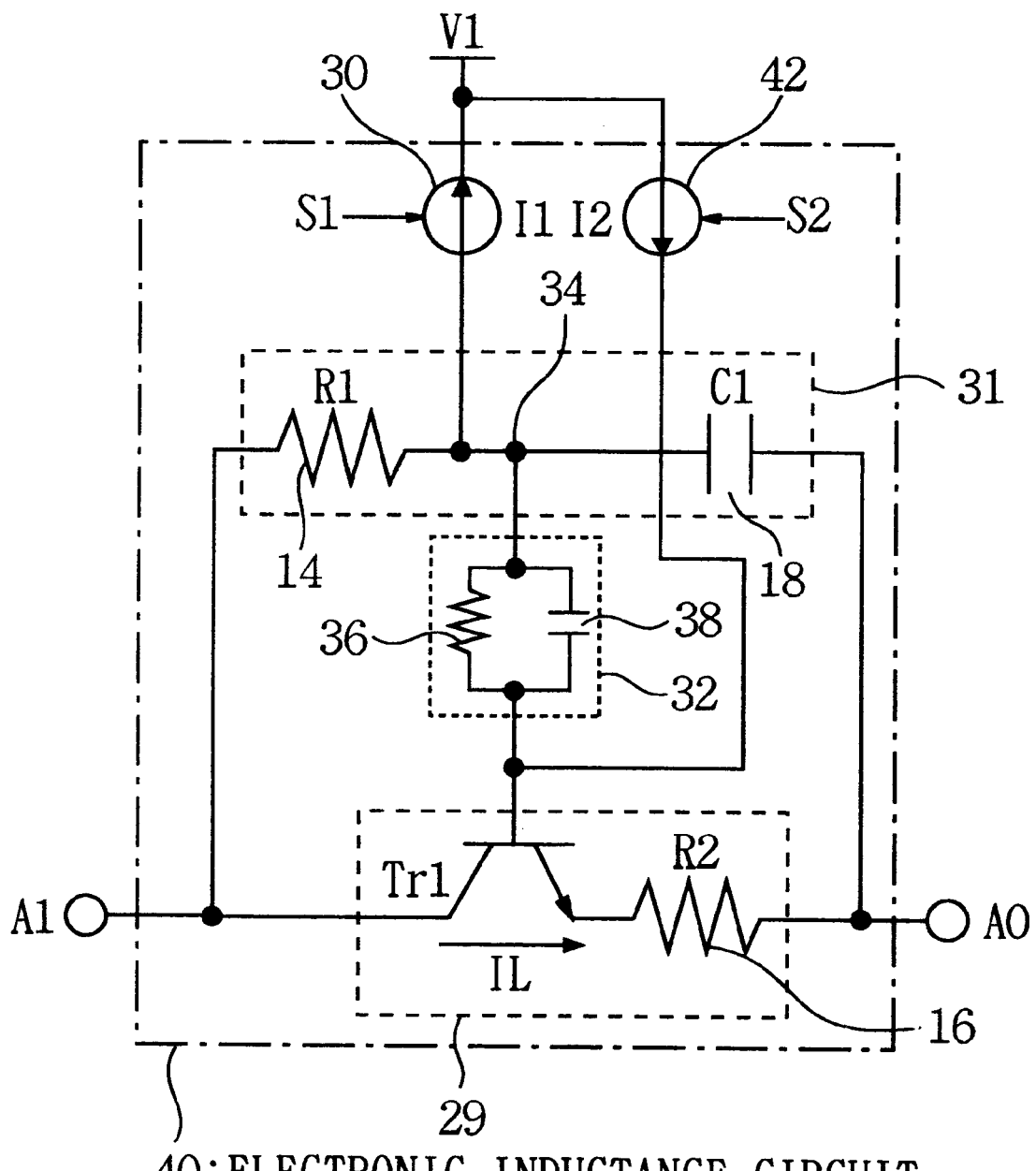
FIG. 3 is a circuit diagram showing the structure of an electronic inductance circuit of a second embodiment using an NPN transistor.

FIG. 3 is a circuit diagram that shows the structure of an electronic inductance circuit of the second embodiment. The electronic inductance circuit 40 of the second embodiment shown in FIG. 3 has a second current source 42 in addition to the structure of the electronic inductance circuit 28 of the first embodiment.

This current source 42 is connected to the base terminal of the NPN transistor Tr1. This current source 42 is connected to the external power supply V1 as well. When one wishes to implement the electronic inductance function, this current source 42 does not flow current to the base terminal of the transistor Tr1, and when one does not wish to implement the electronic inductance function, it does flow current to the base terminal of the transistor Tr1. Therefore, the current source 42 generates a current I2 according to the stop control signal (logic control on/off) S2 input from outside. Specifically, when the stop control signal S2 is turned on, the current I2 is generated from the current source 42, and when the stop control signal S2 is turned off, the current source 42 stops generating the current I2. This current I2 flows from the external power supply V1 toward the base terminal of the transistor Tr1. The value of this current I2 is a value that saturates the transistor Tr1, specifically, it is selected to be a value that saturates the voltage drop between the collector terminal and the emitter terminal of the transistor Tr1.

With the current source 42 in a state that does not generate the current I2 (a state where I2 is 0 A (amperes)), this is equivalent to when this current source 42 does not exist. In this case, the electronic inductance circuit 40 is equivalent to the electronic inductance circuit 28 of the first embodiment, and while the speech current IL is allowed to pass, the alternating current components are suppressed.

In comparison to this, when the current source 42 is in a state where it does generate the current I2, regardless of whether there is a current source 30, the transistor Tr1 is saturated by the current I2. In other words, the collector terminal and the emitter terminal of the transistor Tr1 are brought into a short-circuit therebetween. Because of this, the current input from the terminal A1 is transmitted to the terminal A0 with the alternating current components still included. Specifically, this is a state where the electronic inductance circuit basic function is not implemented.

Figure 16:
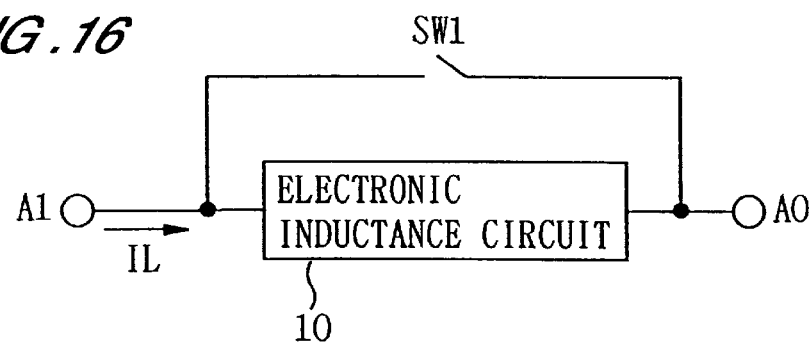
FIG. 16 is a block diagram that provides an explanation of the problems of conventional circuits.
Figure 17:
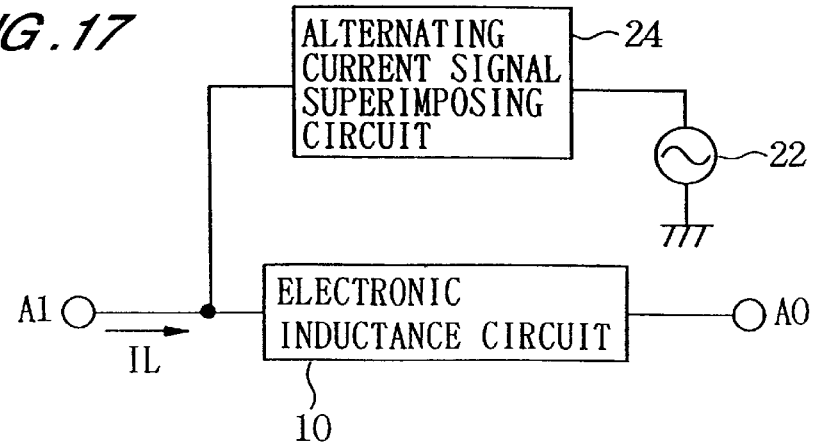
FIG. 17 is a block diagram that provides an explanation of the problems of conventional circuits.

In this way, with the simple structure of providing only the current source 42, it is possible to switch as desired between a state where the inductance function is implemented and a state where the inductance function is stopped. Accordingly, as with the conventional example shown in FIG. 16, the switch connected in parallel to the electronic inductance circuit is not necessary, so the number of parts to be used in an electronic inductance circuit and circuit components therein can be reduced.

It is also easy to incorporate this current source 42 in an LSI circuit. Therefore, component size can be reduced.

Figure 4:
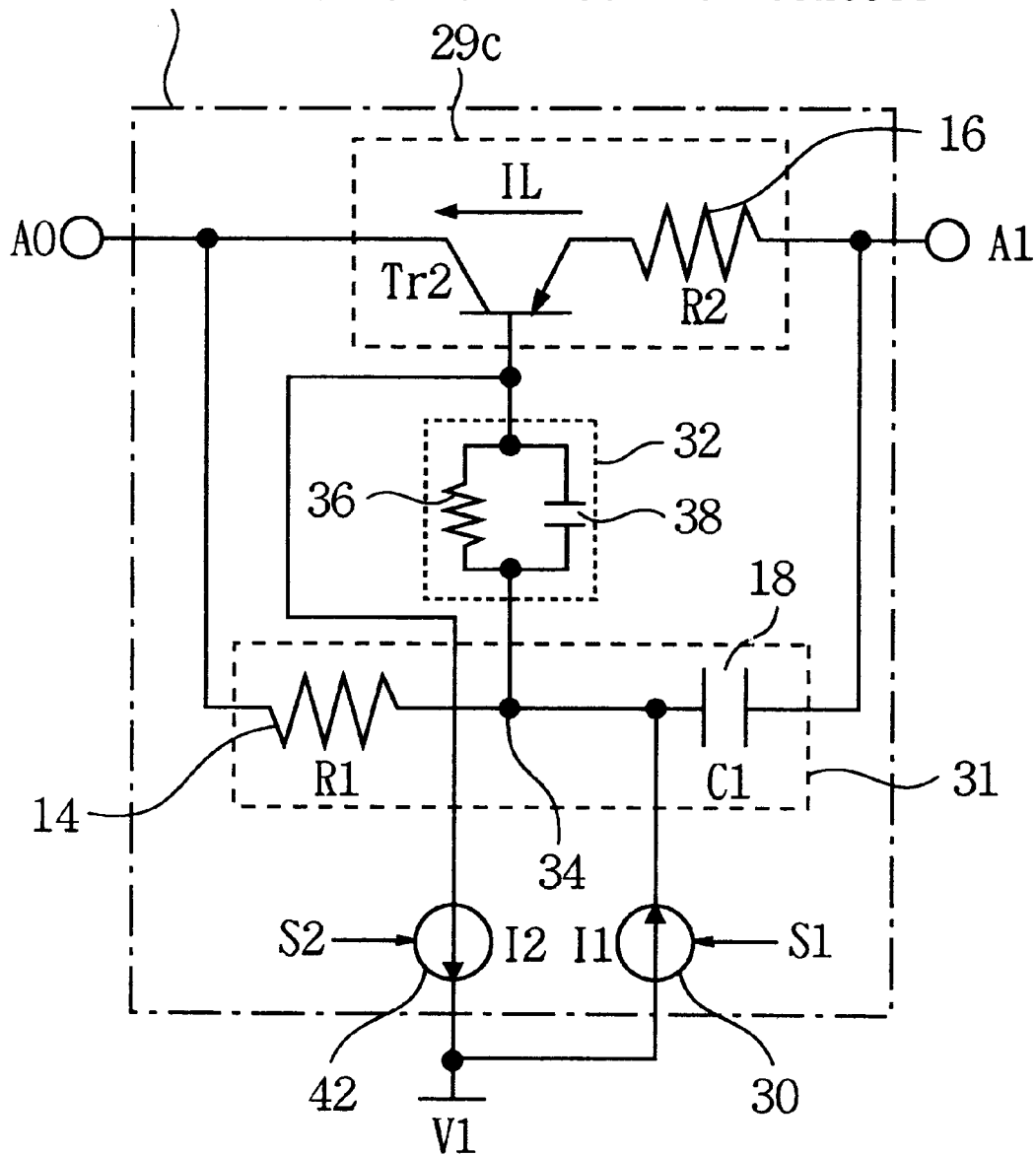
FIG. 4 is a circuit diagram showing the structure of an electronic inductance circuit of a second embodiment using a PNP transistor.

Furthermore, the electronic inductance circuit 40 shown in FIG. 3 used an NPN transistor, but it is also acceptable to construct this using a PNP transistor. FIG. 4 is a circuit diagram showing the structure of an electronic inductance circuit of the second embodiment constructed using a PNP transistor. The electronic inductance circuit 40$a$ of the second embodiment shown in FIG. 4 has a second current source 42 in addition to the structure of the electronic inductance circuit 28$b$ of the first embodiment.

This current source 42 is connected to the base terminal of the transistor Tr2 This current source 42 is also connected to the external power supply V1. The current I2 generated by the current source 42 flows from the base terminal of the transistor Tr2 toward the external power supply V1. This current I2 is set to a value that saturates the transistor Tr2 specifically, it is selected to be a value that saturates the voltage drop between the collector terminal and the emitter terminal of the transistor Tr2.

In this way, the circuit shown in FIG. 4 is symmetrical with the circuit shown in FIG. 3. The circuit shown in FIG. 4 also operates in the same manner as the circuit shown in FIG. 3.

Third Embodiment

Next, while referring to FIG. 5, explanation will be given to the electronic inductance circuit of a third embodiment. The electronic inductance circuit of the third embodiment has an alternating current signal superimposing function.

Figure 5:
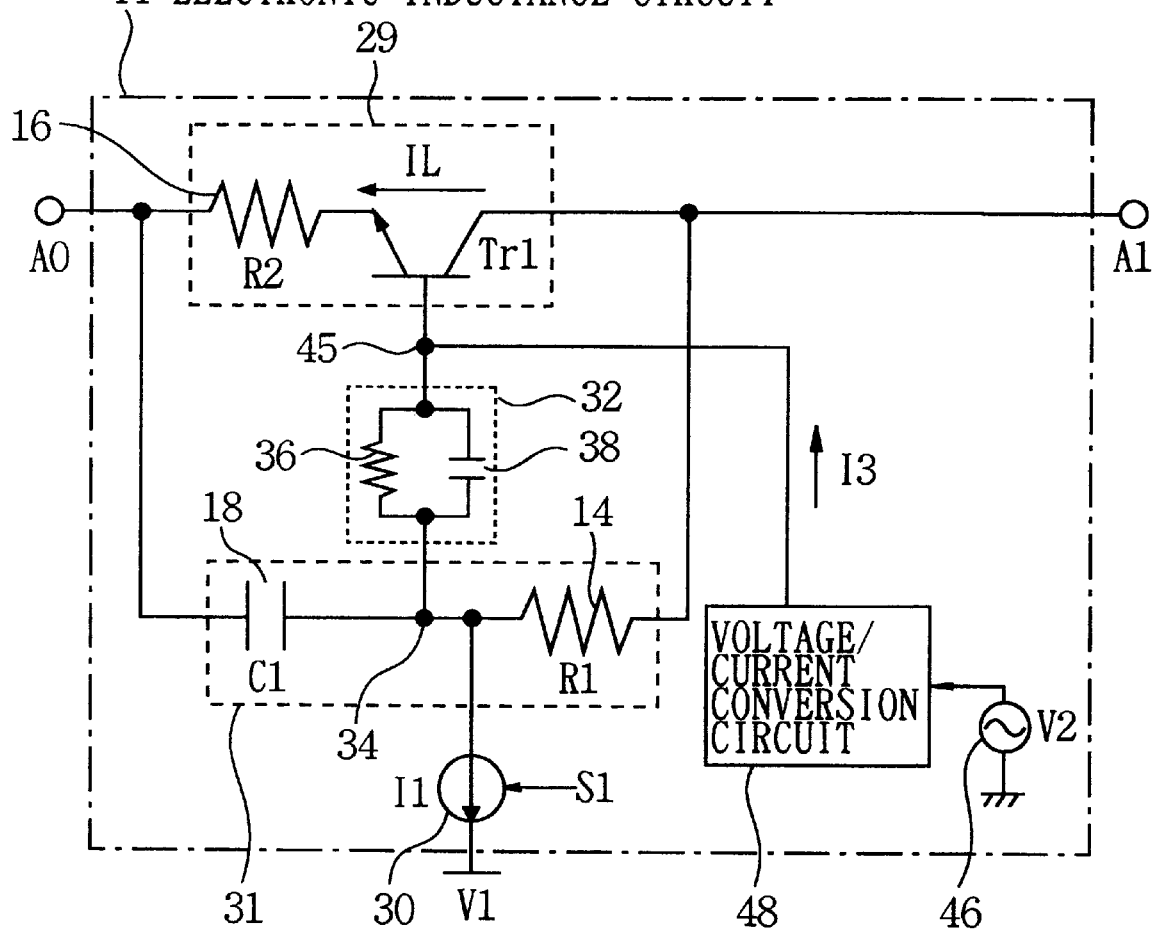
FIG. 5 is a circuit diagram showing the structure of an electronic inductance circuit of a third embodiment using an NPN transistor.

FIG. 5 is a circuit diagram that shows the structure of an electronic inductance circuit of the third embodiment. The electronic inductance circuit 44 of the third embodiment shown in FIG. 5 has an alternating current power supply 46 and a voltage/current conversion circuit 48 in addition to the structure of the electronic inductance circuit 28 of the first embodiment.

With this electronic inductance circuit 44, the connection point of the base terminal of the NPN transistor Tr1 and the filter 32 is the input unit 45 to which is applied a current based on the alternating current signal. Then, this alternating current signal is superimposed on the direct current IL that flows to the main current path of the transistor Tr1.

The output terminal of the voltage/current conversion circuit 48 is connected to the base terminal of the transistor Tr1, in other words, the input unit 45. The input terminal of this voltage/current conversion circuit 48 is connected to the alternating current power supply 46. The alternating current power supply 46, using external control, generates as necessary an alternating current signal superimposed on the direct current (speech current) IL as a voltage signal V2. The voltage signal V2 generated by this alternating current power supply 46 is converted to an alternating current signal I3 by the voltage/current conversion circuit 48. This current signal I3 is input to the base terminal of the transistor Tr1.

When the alternating current power supply 46 does not generate the voltage signal V2 (when V2=0 V (volts)), this state is equivalent to there being no alternating current power supply 46 and voltage/current conversion circuit 48. In this case, the electronic inductance circuit 44 is equivalent to the electronic inductance circuit 28 of the first embodiment, which allows the speech current IL to pass, while suppressing alternating current components. The direct current operating point is represented by the above-mentioned equation (3).

In comparison to this, when one wishes to generate a broad amplitude signal at terminal A0, the voltage/current conversion circuit 48 is turned on by a control signal from outside. Specifically, when the voltage signal V2 is output from the alternating current power supply 46, this voltage signal V2 is converted to the current signal I3 by the voltage/current conversion circuit 48. When the input impedance of the transistor Tr1 is sufficiently small compared to the combined impedance of the resistor 36 and the capacitor 38 that construct the filter 32, all of the current signal I3 flows to the base terminal of the transistor Tr1. The current signal I3 undergoes current amplification to a multiple of hfe by the transistor Tr1, and is superimposed on the direct current (speech current) IL. The direct current IL on which was superimposed the alternating current signal flows to the load resistor connected between the terminals A0 and A1, and causes a voltage drop. The value of this voltage drop is represented by (I3×hfe×load resistance value). Therefore, if the current signal I3 is made large, it is possible to send a broad amplitude alternating current signal (e.g. a howler tone) to the terminal A0. Also, when sending an alternating current signal that is smaller than this amplitude, it is desirable to decrease the voltage from the alternating current power supply 46 (or the alternating current signal I3).

Furthermore, when the input impedance of the transistor Tr1 is greater than the combined impedance of the filter 32, the current signal I3 flows not only to the transistor Tr1 but also to the filter 32. The combined impedance of the filter 32 is dependent on the frequency of the alternating current signal. Therefore, the resistance value of the resistor 36 and the capacity of the capacitor 38 are determined according to the frequency of the alternating current signal to be superimposed, and the combined impedance of the filter 32 is set. As a result, when the input impedance of the transistor Tr1 is made sufficiently small compared to the combined impedance of the filter 32, a broad amplitude signal is sent to the terminal A0.

In this way, with the electronic inductance circuit 44 of the third embodiment, using the basic structural elements (e.g. transistor Tr1) of the electronic inductance circuit, an alternating current signal is superimposed on the speech current. Therefore, it is no longer necessary to use an independent alternating current signal superimposing circuit separate from the electronic inductance circuit as was the case conventionally. Thus, the electronic inductance circuit has fewer parts and circuits therein compared to the conventional technology.

It is also easy to incorporate the voltage/current conversion circuit 48 in an LSI circuit. Therefore, component size can be smaller.

Figure 6:
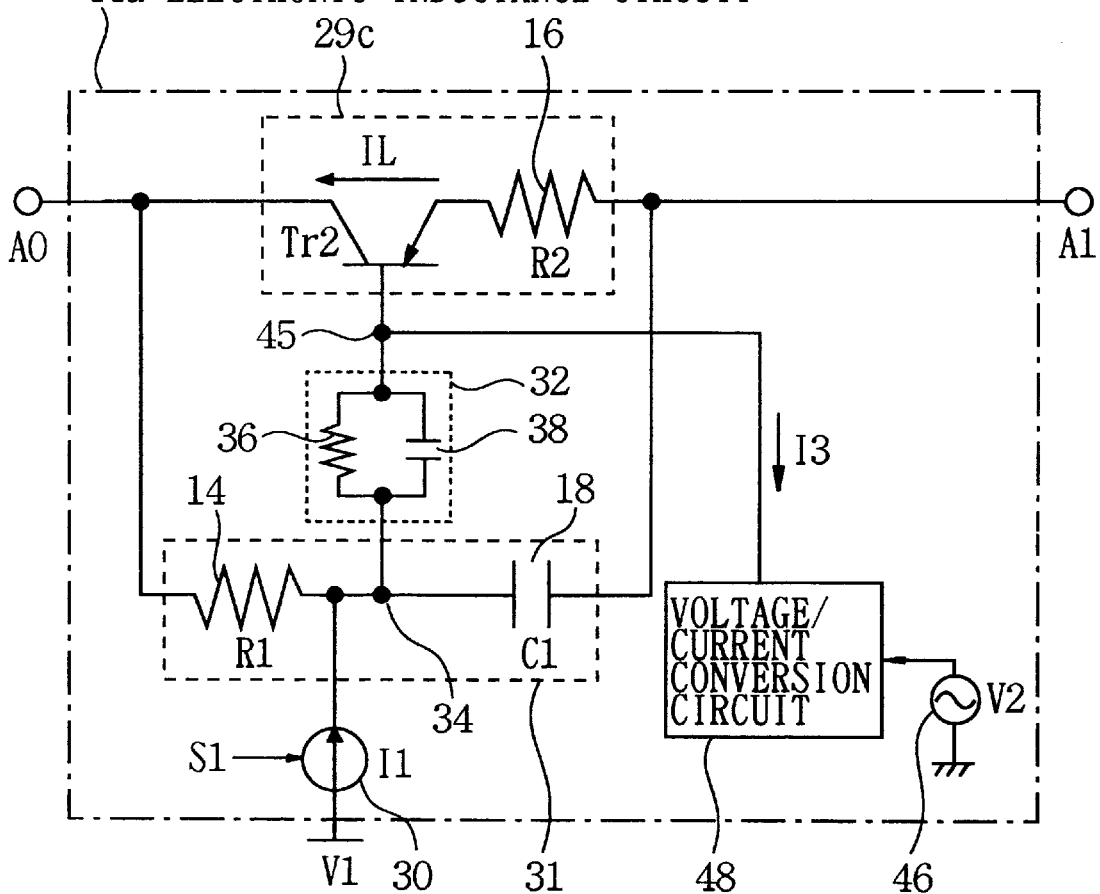
FIG. 6 is a circuit diagram showing the structure of an electronic inductance circuit of a third embodiment using a PNP transistor.

Furthermore, the electronic inductance circuit 44 shown in FIG. 5 uses an NPN transistor, but it is also acceptable to construct this using a PNP transistor. FIG. 6 is a circuit diagram showing the structure of an electronic inductance circuit of the third embodiment constructed using a PNP transistor. The electronic inductance circuit 44a of the third embodiment shown in FIG. 6 has an alternating current power supply 46 and a voltage/current conversion circuit 48 in addition to the structure of the electronic inductance circuit 28b of the first embodiment. Then, the output terminal of the voltage/current conversion circuit 48 is connected to the base terminal of the transistor Tr2 in other words, the input unit 45. The input terminal of this voltage/current conversion circuit 48 is connected to the alternating current power supply 46. The direction of flow of the current signal I3 converted by the voltage/current conversion circuit 48 is the direction of the voltage/current conversion circuit 48 from the base terminal of the transistor Tr2.

In this way, the circuit shown in FIG. 6 is symmetrical to the circuit shown in FIG. 5. The circuit shown in FIG. 6 also operates in the same manner as the circuit shown in FIG. 5.

Fourth Embodiment

Next, explanation will be given to an electronic inductance circuit of a fourth embodiment while referring to FIG. 7. The electronic inductance circuit of the fourth embodiment has a function for monitoring the direct current (speech current) output from the concerned electronic inductance circuit.

Figure 7:
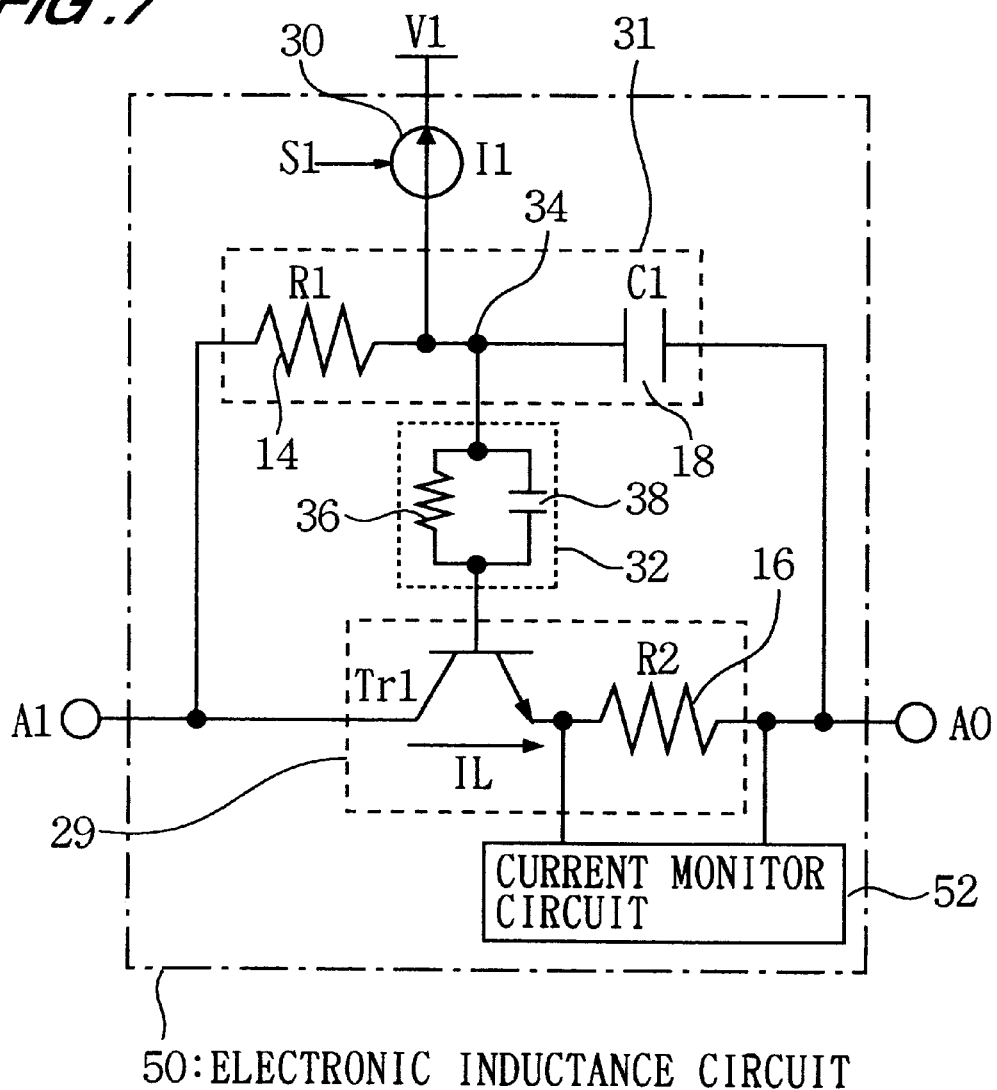
FIG. 7 is a circuit diagram showing the structure of an electronic inductance circuit of a fourth embodiment using an NPN transistor.

FIG. 7 is a circuit diagram showing the structure of an electronic inductance circuit of the fourth embodiment. The electronic inductance circuit 50 of the fourth embodiment shown in FIG. 7 has a current monitoring circuit 52 in addition to the structure of the electronic inductance circuit 28 of the first embodiment.

This current monitoring circuit 52 is connected to both ends of the first resistor 16. When the speech current IL flows to the resistor 16, the voltage drop across the resistor 16 becomes R2×IL. The current monitoring circuit 52 detects speech current IL flowing to the resistor 16 based on the voltage drop at this resistor 16 (voltage at both ends of the resistor 16).

Figure 14:
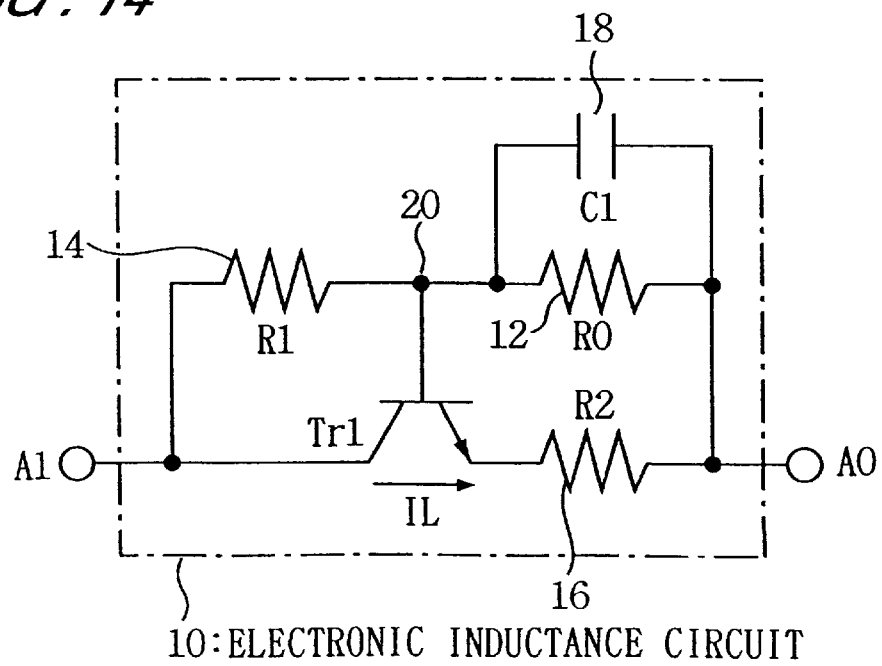
FIG. 14 is a circuit diagram showing an equivalent circuit using an NPN transistor when the circuit of FIG. 13 is divided into single circuits.
Figure 15:
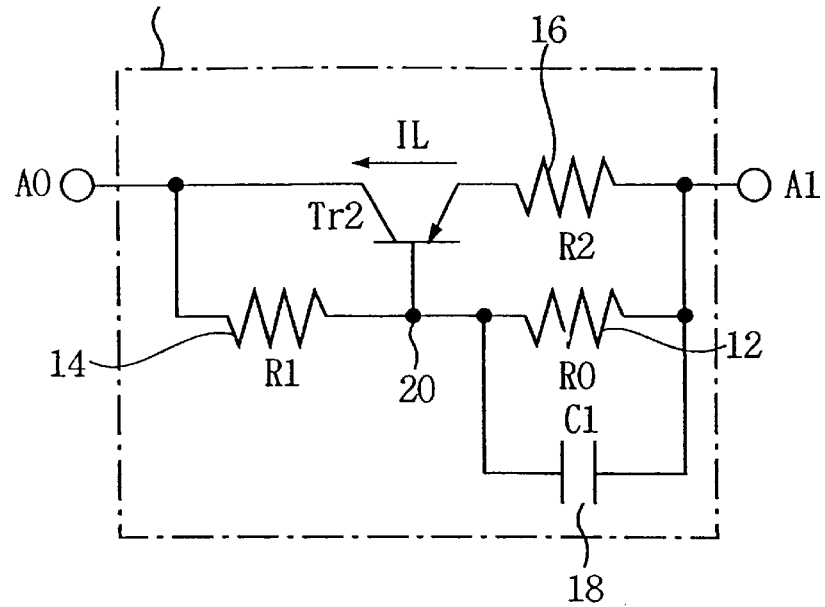
FIG. 15 is a circuit diagram showing an equivalent circuit using a PNP transistor when the circuit of FIG. 13 is divided into single circuits.
Figure 18:
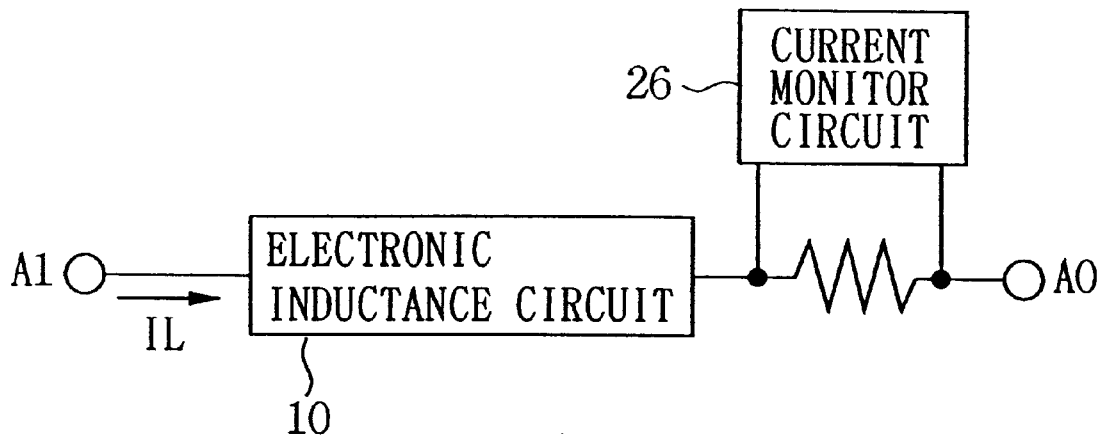
FIG. 18 is a block diagram that provides an explanation of the problems of conventional circuits.

Incidentally, at the conventional electronic inductance circuit 10 shown in FIG. 14, when speech current IL is detected from the voltage drop across the resistor 16, the detection level becomes lower. This is because the circuit shown in FIG. 14 has direct current, though only a slight amount, flowing to the serial circuit of the resistors 14 and 12 as well. Therefore, conventionally, as shown in FIG. 18, a resistor RE is provided in series external to the electronic inductance circuit, and the system is set such that voltage at both ends is detected.

On the other hand, with the electronic inductance circuit 50 of the fourth embodiment, using the basic structural elements (e.g. the resistor 16) of the electronic inductance circuit, speech current IL is detected. Therefore, it is no longer necessary to use a separate, independent resistor RE from the electronic inductance circuit as was the case conventionally. Thus, compared to the conventional technology, the number of parts to be used in the electronic inductance circuit and circuit components therein are reduced. In fact, it is possible to reduce power consumption by the amount of power consumed by the resistor RE.

Figure 8:
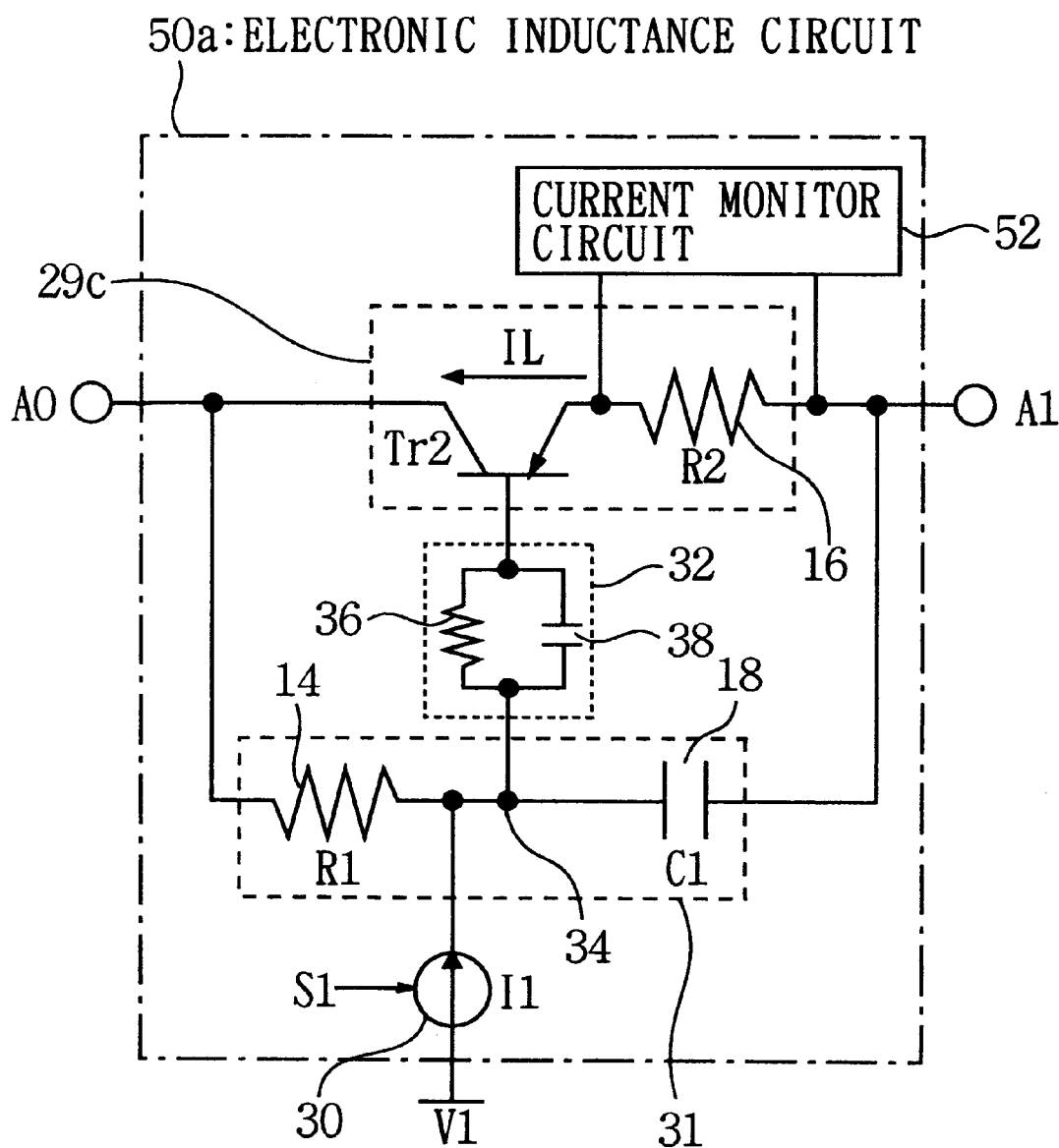
FIG. 8 is a circuit diagram showing the structure of an electronic inductance circuit of a fourth embodiment using a PNP transistor.

Furthermore, the electronic inductance circuit 50 shown in FIG. 7 uses an NPN transistor, but it is also acceptable to construct this using a PNP transistor. FIG. 8 is a circuit diagram showing the structure of an electronic inductance circuit of the fourth embodiment constructed using a PNP transistor. The electronic inductance circuit 50a of the fourth embodiment shown in FIG. 8 has a current monitoring circuit 52 in addition to the structure of the electronic inductance circuit 28b of the first embodiment. This current monitoring circuit 52 is connected to both ends of the first resistor 16.

In this way, the circuit shown in FIG. 8 is symmetrical with the circuit shown in FIG. 7. The circuit shown in FIG. 8 also operates in the same manner as the circuit shown in FIG. 7.

Fifth Embodiment

Next, explanation will be given to an electronic inductance circuit of a fifth embodiment while referring to FIG. 9. The electronic inductance circuit of the fifth embodiment has a direct current (speech current) blocking function within the concerned electronic inductance circuit.

Figure 9:
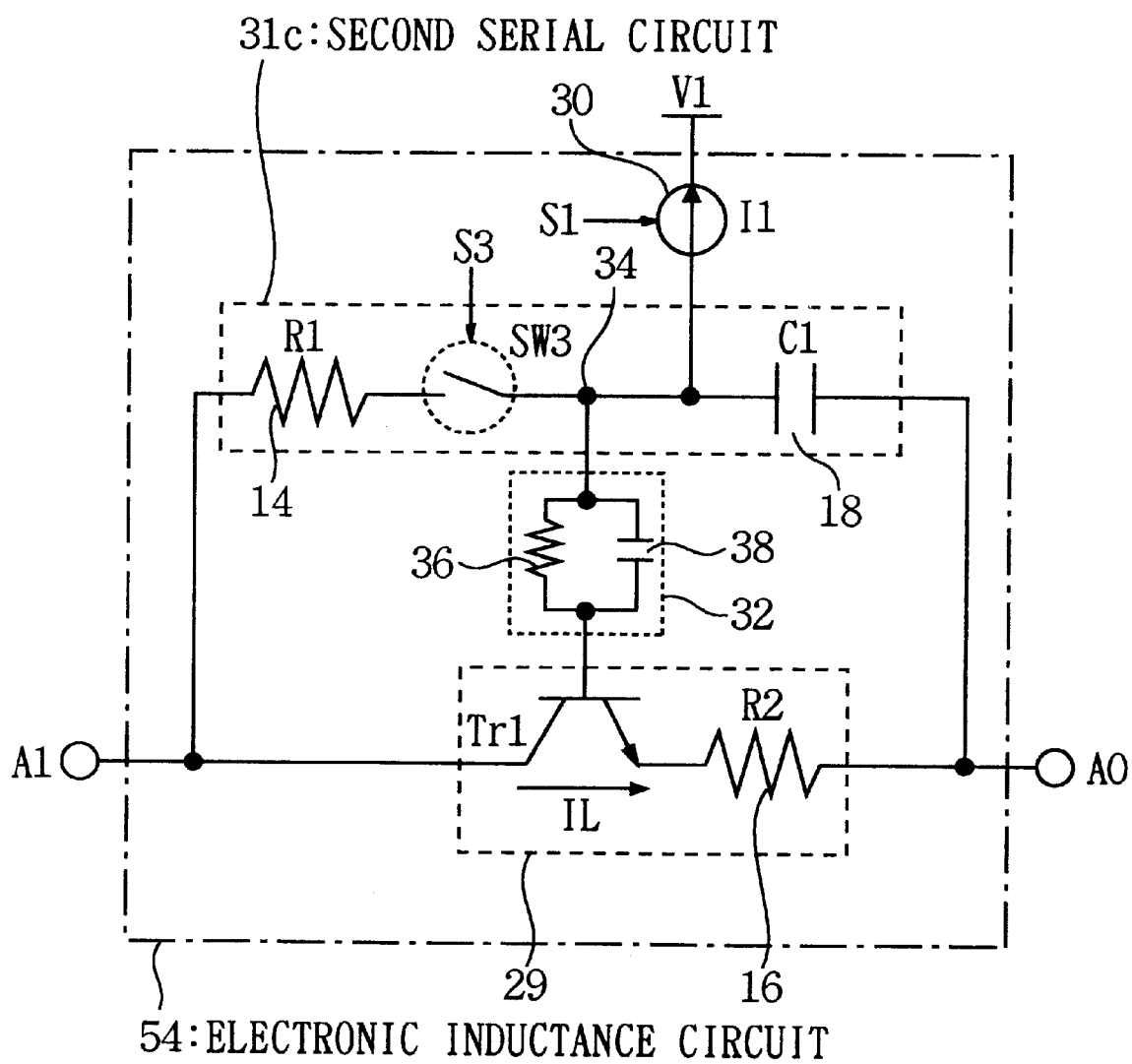
FIG. 9 is a circuit diagram showing the structure of an electronic inductance circuit of a fifth embodiment using an NPN transistor.

FIG. 9 is a circuit diagram showing the structure of an electronic inductance circuit of the fifth embodiment. The electronic inductance circuit 54 of the fifth embodiment shown in FIG. 9 has a switch SW3 in addition to the structure of the electronic inductance circuit 28 of the first embodiment.

This switch SW3 is connected in series to the second resistor 14. With this example, the switch SW3 is inserted between the connection point 34 between the resistor 14 and the capacitor 18 and one end of the resistor 14. The resistor 14, the switch SW3, and the capacitor 18 construct a second serial circuit 31c. This switch SW3 performs a switching operation according to an on/off control signal S3 input from outside.

When the switch SW3 is on, the switch SW3 goes to a conductive state. Therefore, the electronic inductance circuit 54 is equivalent to the circuit of the first embodiment. Accordingly, the base current of the transistor Tr1 can flow through the switch SW3 and the resistor 14. Thus, the speech current IL flows within the electronic inductance circuit 54 in the sequence of the terminal A1, the main current path of the NPN transistor Tr1, the resistor 16, and the terminal A0.

To block the speech current IL, specifically, to stop the supply of the speech current IL to the load resistor (telephone terminal, etc.) that is connected to the terminal A0, the switch SW3 is switched to an off state. At this time, the switch SW3 is in a non-conductive state. Because of this, the base current does not flow to the transistor Tr1, and the transistor Tr1 is in an off operation state. Therefore, the speech current IL can not flow to the terminal A0 side.

Figure 19:
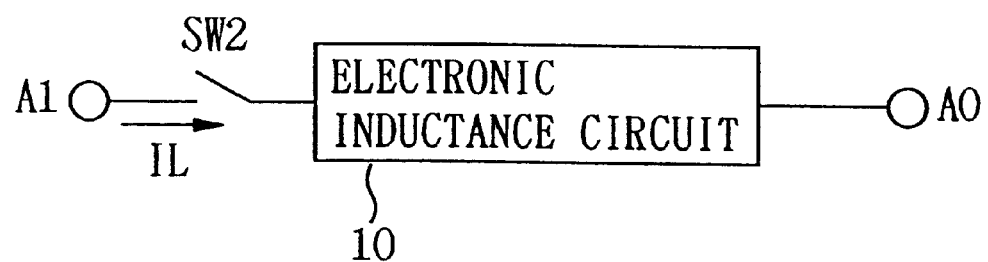
FIG. 19 is a block diagram that provides an explanation of the problems of conventional circuits.

In this way, with a simple structure of providing a switch SW3 in series with the resistor 14, it is possible to block the speech current IL using the concerned electronic inductance circuit 54 as desired. The switch SW3 is built into the electronic inductance circuit 54, so as with the conventional circuit shown in FIG. 19, a switch that can handle high withstand voltage and high current is not necessary. Therefore, the electronic inductance circuit has fewer parts as compared with prior art.

Also, as a conventional switch, a thyristor or transistor that can handle high withstand voltage and high current is necessary. Because of this, a large volume of power is consumed. However, with this fifth embodiment, the switch SW3 is inserted outside of the path in which the speech current flows, so the switch SW3 can be a switch that handles small current. Therefore, besides the consumption power being smaller than the conventional technology, smaller size of the device is possible. If necessary, this switch SW3 can be incorporated into the same LSI as the electronic inductance circuit 54.

Figure 10:
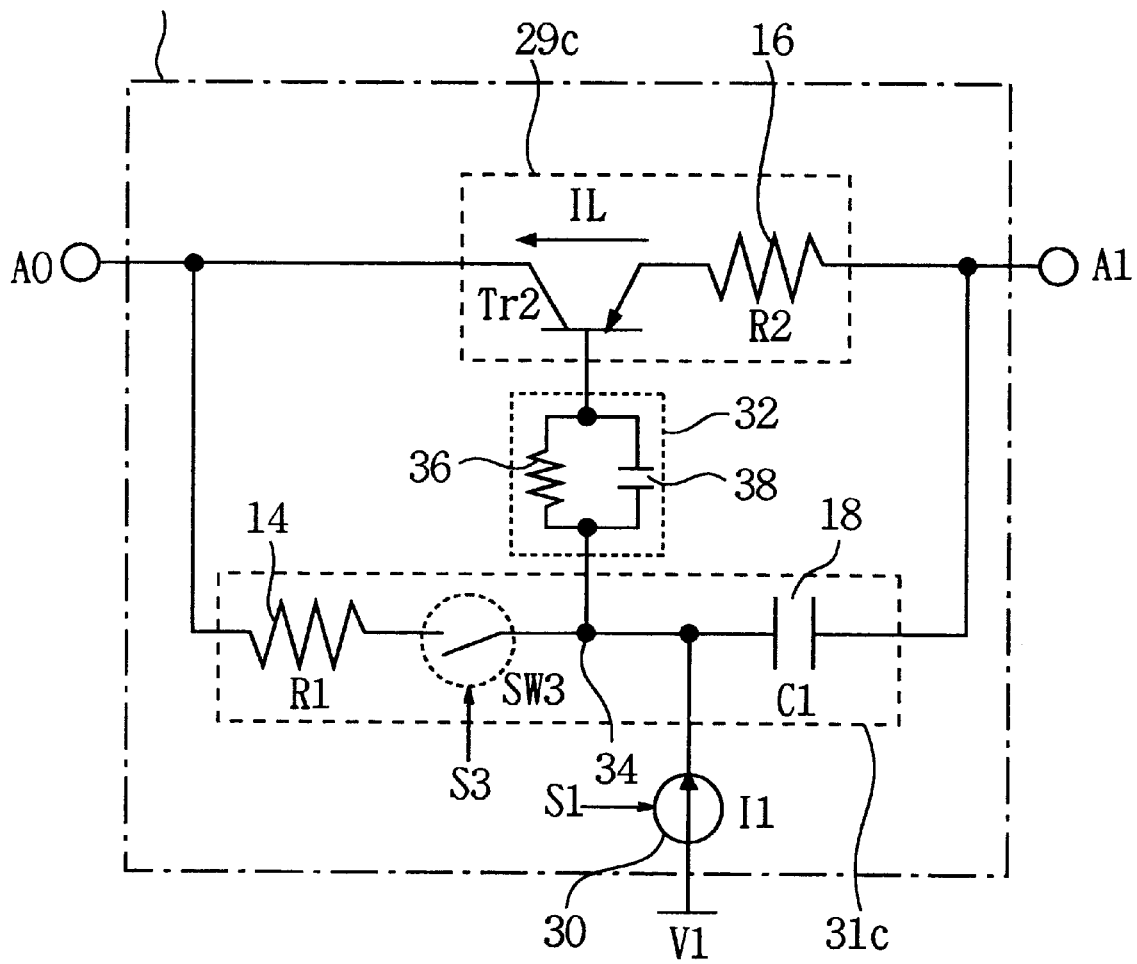
FIG. 10 is a circuit diagram showing the structure of an electronic inductance circuit of a fifth embodiment using a PNP transistor.

Furthermore, the electronic inductance circuit 54 shown in FIG. 9 uses an NPN transistor, but it is also acceptable to construct it using a PNP transistor. FIG. 10 is a circuit diagram showing the structure of an electronic inductance circuit of the fifth embodiment constructed using a PNP transistor. The electronic inductance circuit 54a of the fifth embodiment shown in FIG. 10 has a switch SW3 in addition to the structure of the electronic inductance circuit 28b of the first embodiment. This switch SW3 is connected in series to the second resistor 14.

In this way, the circuit shown in FIG. 10 is symmetrical with the circuit shown in FIG. 9. The circuit shown in FIG. 10 also operates in the same manner as the circuit shown in FIG. 9.

Sixth Embodiment

Figure 11:
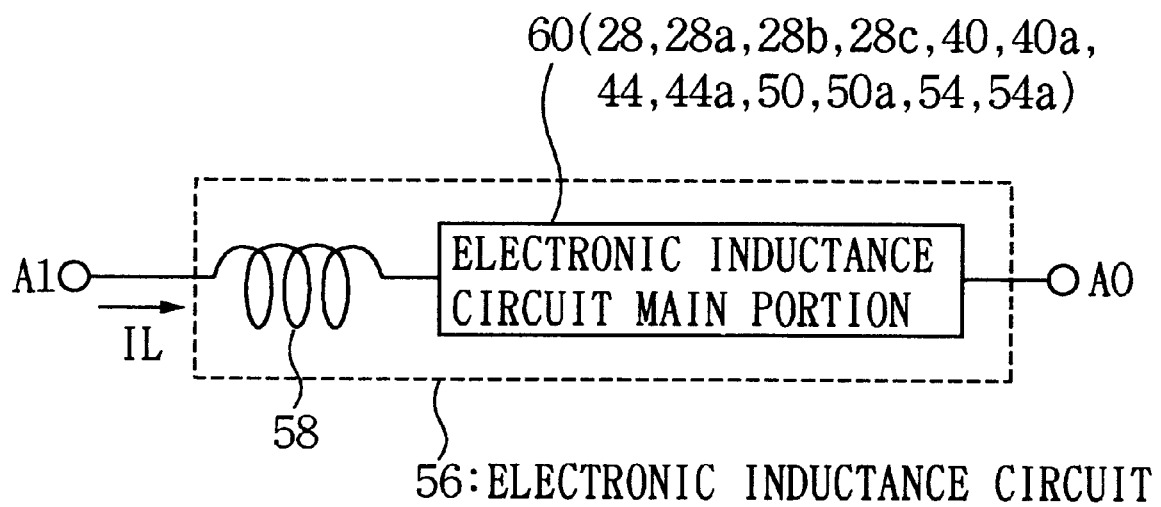
FIG. 11 is a circuit diagram showing the structure of an electronic inductance circuit of a sixth embodiment.

Next, explanation will be given to an electronic inductance circuit of a sixth embodiment while referring to FIG. 11. FIG. 11 is a circuit diagram showing the structure of an electronic inductance circuit of the sixth embodiment.

The electronic inductance circuit 56 of the sixth embodiment shown in FIG. 11 comprises a choke coil 58 connected in series to the input terminal A1. Specifically, the choke coil 58 and the electronic inductance circuit main portion 60 are connected in series between the terminals A1 and A0. As this electronic inductance circuit main portion 60, one of the electronic inductance circuits 28, 28a, 28b, 28c, 40, 40a, 44, 44a, 50, 50a, 54, and 54a from any of the above-mentioned embodiments can be used. The speech current IL flows in the sequence of terminal A1, the choke coil 58, the electronic inductance circuit main portion 60, and the terminal A0.

If there is no choke coil 58, when the frequency of the alternating signal superimposed on the speech current IL becomes high, there may be cases when the transistor Tr1 or the transistor Tr2 that construct the electronic inductance circuit main portion 60 can not keep up with the frequency. As a result, there is a risk that the alternating current impedance of the electronic inductance circuit main portion 60 will become small.

On the other hand, with this electronic inductance circuit 56 of the sixth embodiment, by inserting a choke coil 58, the overall alternating current impedance of the electronic inductance circuit 56 becomes higher. Therefore, with this electronic inductance circuit 56, the alternating impedance between the terminals A1 and A0 becomes higher over a broad band.

Furthermore, with a combination of the frequency characteristics of the transistors Tr1 or Tr2 that construct the electronic inductance circuit main portion 60 and the inductance value of the choke coil 58, it is possible to make a design that takes into consideration characteristics, mounting format, and cost.

Seventh Embodiment

Figure 12:
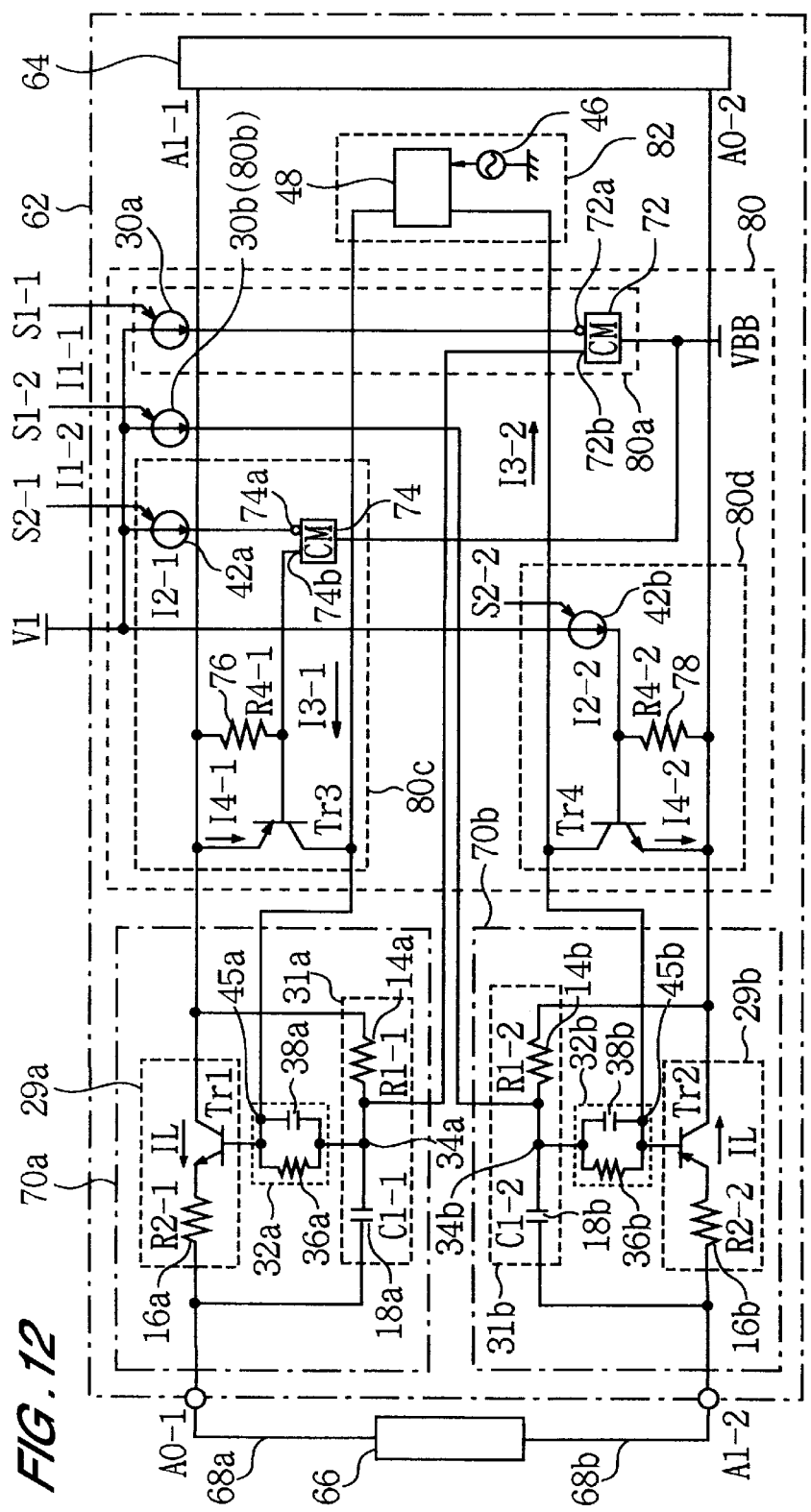
FIG. 12 is a circuit diagram showing the structure of an electronic inductance circuit of a seventh embodiment.
Figure 13:
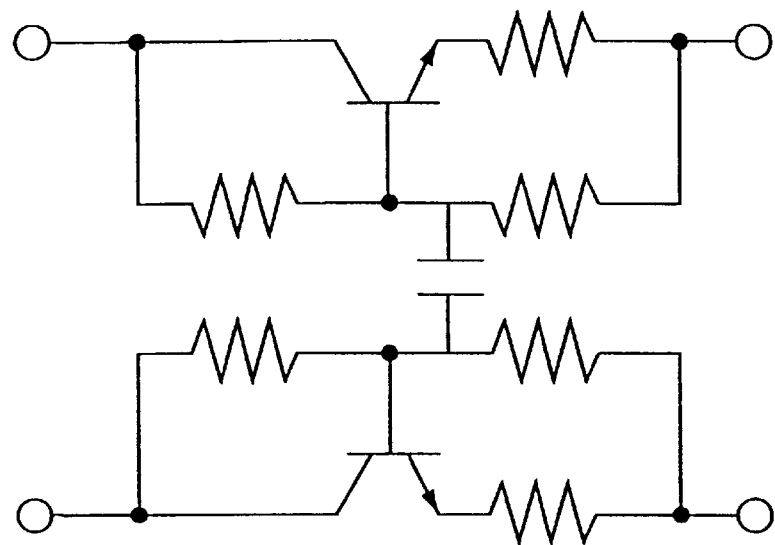
FIG. 13 is a circuit diagram showing the structure of a conventional electronic inductance circuit having two circuits.

Next, explanation will be given to an electronic inductance circuit of a seventh embodiment while referring to FIG. 12. FIG. 12 is a circuit diagram showing the structure of an electronic inductance circuit of the seventh embodiment. The electronic inductance circuit 62 of the seventh embodiment correlates to a combination of each structure of the above-mentioned first, second, and third embodiments.

This electronic inductance circuit 62 of the seventh embodiment comprises an input terminal A1-2, an output terminal A0-1, a first inductance circuit unit 70a, a second inductance circuit unit 70b, a current supply circuit 64, a current source group 80, and an alternating current power supply unit 82. The output terminal A0-1 and the current supply circuit 64 are connected by an output line 84 via a first inductance circuit unit 70a. The input terminal A1-2 and the current supply circuit 64 are connected by an input line 86 via a second inductance circuit unit 70b.

The current supply circuit 64 supplies a speech current IL through the first inductance circuit unit 70a to a subscriber terminal (internal line or external line) 66 that is connected between the input terminal A1-2 and the output terminal A0-1. Also, the current supply circuit 64 inputs the speech current IL that flows out from the subscriber terminal 66 through the second inductance circuit unit 70b. Specifically, the speech current IL output from the output terminal A1-1 of the current supply circuit 64 is sent using the output line 84. This speech current IL, after passing through the first inductance circuit unit 70a, is input to the subscriber line 68a via the output terminal A0-1. The speech current IL flows through the subscriber line 68a and is supplied to the subscriber terminal 66. Also, the speech current IL output from the subscriber terminal 66 flows through the subscriber line 68b and is input to the input terminal A1-2. Then, the speech current IL is input to the input terminal A0-2 of the current supply circuit 64 through the input line 86.

The electronic inductance circuit unit 70a provided on the flow-out path side comprises an NPN transistor Tr1, resistors 14a and 16a, a capacitor 18a, and a filter 32a. This filter 32a is composed from a resistor 36a and a capacitor 38a. Each of these structural elements is provided between the terminals A1-1 and A0-1. Then, the NPN transistor Tr1, the resistor 14a, the resistor 16a, the capacitor 18a, the filter 32a, the resistor 36a, and the capacitor 38a each correspond to the NPN transistor Tr1, the resistor 14, the resistor 16, the capacitor 18, the filter 32, the resistor 36, and the capacitor 38 shown in FIG. 1A. Also, the connection point 34a in the electronic inductance circuit unit 70a corresponds to the connection point 34 shown in FIG. 1A. Furthermore, the first serial circuit 29a constructed from the transistor Tr1 and the resistor 16a corresponds to the first serial circuit 29 shown in FIG. 1A, and the second serial circuit 31a constructed from the resistor 14a and the capacitor 18a corresponds to the second serial circuit 31 shown in FIG. 1A. The first serial circuit 29a and the second serial circuit 31a are parallel to each other, and are each connected in series within the output line 84.

On the other hand, the electronic inductance circuit unit 70b provided on the flow-in path side comprises a PNP transistor Tr2 resistors 14b and 16b, a capacitor 18b, and a filter 32b. This filter 32b is composed from a resistor 36b and a capacitor 38b. Each of these structural elements is provided between the terminals A1-2 and A0-2. Then, the PNP transistor Tr2 the resistor 14b, the resistor 16b, the capacitor 18b, the filter 32b, the resistor 36b, and the capacitor 38b each correspond to the PNP transistor Tr2 the resistor 14, the resistor 16, the capacitor 18, the filter 32, the resistor 36, and the capacitor 38 shown in FIG. 2A. Also, the connection point 34b within the electronic inductance circuit unit 70b corresponds to the connection point 34 shown in FIG. 2A. Furthermore, the first serial circuit 29b constructed from the transistor Tr2 and the resistor 16b corresponds to the first serial circuit 29 shown in FIG. 1A, and the second serial circuit 31bconstructed from the resistor 14b and the capacitor 18b corresponds to the second serial circuit 31 shown in FIG. 1A. The first serial circuit 29b and the second serial circuit 31b are in parallel to each other, and each is connected in series within the input line 86.

Also, the above-mentioned current source group 80 comprises a first current source unit 80a, a second current source unit 80b, a third current source unit 80c, and a fourth current source unit 80*d*. The first current source unit 80*a* is constructed from a current source 30*a* and a current mirror circuit (CM) 72. The second current source unit 80*b* is constructed from a current source 30*b*. The third current source unit 80*c* is constructed from a current source 42*a*, a current mirror circuit (CM) 74, a PNP transistor Tr3 and a resistor 76. The fourth current source unit 80*d* is constructed from a current source 42*b*, a transistor Tr4, and a resistor 78.

Each current source 30*a*, 30*b*, 42*a*, and 42*b* is connected to an external power supply V1, respectively. Each current mirror circuit 72 and 74 is connected to an external power supply VBB, respectively.

The first terminal 72*a* of the current mirror circuit 72 is connected to the current source 30*a*. The second terminal 72*b* of this current mirror circuit 72 is connected to the connection point 34*a* of the electronic inductance circuit unit 70*a*.

Also, the first terminal 74*a* of the current mirror circuit 74 is connected to the current source 42*a*. The second terminal 74*b* of this current mirror circuit 74 is connected to the base terminal of the transistor Tr3.

The collector terminal of this transistor Tr3 is connected to the terminal A1-1, in other words, the collector terminal of the transistor Tr1. Also, the emitter terminal of this transistor Tr3 is connected to the base terminal of the transistor Tr1, in other words, the input unit 45*a*. The resistor 76 is connected between the emitter terminal and base terminal of this transistor Tr3.

The current source 30*b* is connected to the connection point 34*b* of the electronic inductance circuit unit 70*b*. Then, the current source 42*b* is connected to the base terminal of the transistor Tr4.

The collector terminal of this transistor Tr4 is connected to the base terminal of the transistor Tr2 in other words, the input unit 45*b*. Also, the emitter terminal of this transistor Tr4 is connected to the collector terminal of the transistor Tr2 The resistor 78 is connected between the base terminal and the emitter terminal of this transistor Tr4.

The above-mentioned current source 30*a* generates a current I1-1 of a value according to an operating range control signal S1-1 input from outside. This current I1-1 is input to the first terminal 72*a* of the current mirror circuit 72. When the current I1-1 is input to the current mirror circuit 72, a current of the same value as the current I1-1 flows out from the connection point 34*a* of the electronic inductance circuit unit 70*a* to the second terminal 72*b* side. The voltage drop between the terminals A1-1 and A0-1 is controlled by this current I1-1. Therefore, the first current source unit 80*a* constructed from the current source 30*a* and the current mirror circuit 72 corresponds to the structure of the current source 30 shown in FIGS. 1A and 1B.

The current source 30*b* generates a current I1-2 of a value corresponding to an operating range control signal S1-2 input from outside. This current I1-2 is input to the connection point 34*b* of the electronic inductance circuit unit 70*b*. The voltage drop between the terminals A1-2 and A0-2 is controlled by this current I1-2. Therefore, the second current source unit 80*b* constructed from the current source 30*b* corresponds to the structure of the current source 30 shown in FIGS. 2A and 2B.

Also, the current source 42*a* generates a current I2-1 corresponding to a stop control signal S2-1 input from outside. This current I2-1 is input to the first terminal 74*a* of the current mirror circuit 74. When the current I2-1 is input to the current mirror circuit 74, a current the same value as this flowing to the second terminal 74*b* flows to the resistor 76. When this happens, the transistor Tr3 goes to an on state, in other words, a low resistance state (conductive state), so the collector current I4-1 of the transistor Tr3 is supplied to the base terminal of the transistor Tr1. As a result, the transistor Tr1 is saturated and goes to a through state, so the inductance function of the electronic inductance circuit unit 70*a* stops. Thus, the third current source unit 80*c* constructed from the current source 42*a*, the current mirror circuit 74, the transistor Tr3 and the resistor 76 corresponds to the current source 42 shown in FIG. 3.

Also, the current source 42*b* generates a current I2-2 corresponding to a stop control signal S2-2 input from outside. This current I2-2 flows toward the resistor 78. At this time, the transistor Tr4 goes to an on state, in other words, a low resistance state (conductive state), so the collector current I4-2 of the transistor Tr4 is supplied from the base terminal of the transistor Tr2 As a result, the transistor Tr2 is saturated and goes to a through state, so the inductance function of the electronic inductance circuit unit 70*b* stops. Thus, the fourth current source unit 80*d* constructed from the transistor Tr4 and the resistor 78 corresponds to the current source 42 shown in FIG. 4.

Furthermore, the above-mentioned alternating current power supply unit 82 comprises an alternating current power supply 46 and a voltage/current conversion circuit 48. The alternating voltage generated by the alternating current power supply 46 is converted to alternating current by the voltage/current conversion circuit 48. The voltage/current conversion circuit 48 outputs this alternating current I3-1 to the electronic inductance circuit unit 70*a* while also inputting the alternating current I3-2 that flows out from the electronic inductance circuit unit 70*b*. The alternating current I3-1 output from the voltage/current conversion circuit 48 is applied to the base terminal of the transistor Tr1, that is, from the input unit 45*a*. The transistor Tr1 constructs the electronic inductance circuit unit 70*a*. Therefore, an alternating current signal based on the alternating current I3-1 is superimposed on the speech current IL that flows through the main current path of the transistor Tr1. On the other hand, the voltage/current conversion circuit 48 causes the alternating current I3-2 to be flowed out from the base terminal of the transistor Tr2 that is, from the input unit 45*b*. The transistor Tr2 constructs the electronic inductance circuit unit 70*b*. Because of this, an alternating current signal based on the alternating current I3-2 is superimposed on the speech current IL that flows through the main current path of the transistor Tr2 Therefore, the alternating current power supply 46 and the voltage/current conversion circuit 48 shown in FIG. 12 correspond to the alternating current power supply 46 and the voltage/current conversion circuit 48 shown in FIGS. 5 and 6.

As described above, the electronic inductance circuit 62 of this seventh embodiment has the functions explained in the first, second, and third embodiments.

First, explanation will be given to the operation when this electronic inductance circuit 62 does not perform alternating current signal superimposing and the inductance function is executed. In this case, while output operation of the alternating current power supply 46 is prohibited, current is also set not to flow from the current sources 42*a* and 42*b*. Then, the same mutual current is output only from the current sources 30*a* and 30*b*. At this time, as explained for the first embodiment, both the electronic inductance circuit units 70*a* and 70*b* allow the direct current IL to pass while suppressing the alternating current components.

Next, explanation will be given to the operation when the electronic inductance circuit 62 does not perform alternating current signal superimposing and the inductance function is stopped. In this case, with output operation of the alternating current power supply 46 left prohibited, the same mutual current is output from the current sources 42a and 42b. At this time, it is preferable to set the system such that current does not flow from the current sources 30a and 30b, but flow can also be allowed. As described with the second embodiment, the transistors Tr1 and Tr2 of each of the electronic inductance circuit units 70a and 70b are saturated, so the inductance function does not work.

Next, explanation will be given to the operation when the electronic inductance circuit 62 performs alternating current signal superimposing in this case, the output operation of the alternating current power supply 46 is executed. At this time, while current flows from the current sources 30a and 30b, current does not flow from the current sources 42a and 42b. As a result, as described in the third embodiment, an alternating current signal is superimposed on a subscriber line.

Also, with the seventh embodiment, when the current supply circuit 64 is a floating feed, the impedance in relation to an in-phase alternating current signal is high. Because of this, even if a large in-phase alternating current induced voltage is applied, this can be tolerated. In fact, there is also an effect of being able to fix the midrange electric potential of the terminals A0-1 and A1-2 to a constant level.

Other Embodiments

The electronic inductance circuit of the present invention is not limited to being used for subscriber circuits of electronic switching apparatus like that described in the first through seventh embodiments. It can also be used for a variety of circuits that require an inductance function. For example, it can be used as an electronic inductance circuit used for a station line terminal circuit of a digital subscriber line transmission system.

Also, with each of the above-mentioned embodiments, single bipolar transistors were used as the transistors in the electronic inductance circuit, but, for example, it is also acceptable to use a bipolar transistor with a Darlington connection. Also, it is acceptable to use a unipolar transistor such as a MOS transistor. Furthermore, there is no restriction to using general materials such as Si or the like, so it is also acceptable to use a GaAs transistor, for example.

Also, with the structure of the above-mentioned embodiments, filters made from resistors and capacitors were used. However, this filter can be omitted except for the case of the third embodiment.

Also, with the seventh embodiment, it is also acceptable for the current supply circuit 64 to be a non-floating feed type.

Furthermore, it is also acceptable to use a PNP transistor for the electronic inductance circuit unit 70a provided on the flow-in path side of the speech current IL, and to use an NPN transistor for the electronic inductance circuit unit 70b on the inflow path side of the speech current IL.

Furthermore, the electronic inductance circuit of the seventh embodiment corresponds to a combination of the structures of the first through third embodiments. Similarly, the invention is not limited to this, and it is possible to realize electronic inductance circuits of optimal structure with any combination using the first through sixth embodiments.

As described above, with the electronic inductance circuit of the present invention, there is less power consumption than in the past, and the structure is even simpler than the conventional technology.

What is claimed is:

1. An electronic inductance circuit comprising:
   a transistor;
   a first resistor;
   a second resistor;
   a capacitor; and
   a first current source;
   a first serial circuit constructed from a main current path of said transistor and said first resistor connected in series between an input terminal and an output terminal;
   a second serial circuit that is constructed from said second resistor and said capacitor connected in series between said input terminal and said output terminal;
   said first serial circuit and said second serial circuit being connected in parallel;
   a connection point between said second resistor and said capacitor being connected to the control terminal of said transistor; and
   said connection point being connected to said first current source for determining the operating point of said transistor.

2. The electronic inductance circuit according to claim 1, comprising a filter coupled between said connection point and the control terminal of said transistor.

3. The electronic inductance circuit according to claim 2, wherein said filter comprises a resistor and a capacitor connected in parallel with each other.

4. The electronic inductance circuit according to claim 1, wherein said connection point is directly connected to the control terminal of said transistor.

5. The electronic inductance circuit according to claim 1, wherein said transistor is an NPN transistor;
   said first serial circuit is connected from said input terminal side in the sequence of the main current path of said transistor and said first resistor; and
   said second serial circuit is connected from said input terminal side in the sequence of said second resistor and said capacitor.

6. The electronic inductance circuit according to claim 1, wherein said transistor is a PNP transistor;
   said first serial circuit is connected from said input terminal side in the sequence of said first resistor and the main current path of said transistor; and
   said second serial circuit is connected from said input terminal side in the sequence of said capacitor and said second resistor.

7. The electronic inductance circuit according to claim 1, wherein said first current source generates a current of a value corresponding to an operating range control signal input from outside, and controls the voltage drop volume across the main current path of said transistor.

8. The electronic inductance circuit according to claim 1, comprising a second current source connected to the control terminal of said transistor, said second current source generating a current of a value that saturates said transistor corresponding to a stop control signal input from outside.

9. The electronic inductance circuit according to claim 2, wherein the connection point of the control terminal of said transistor and said filter is an input unit on which is applied a current based on the alternating current signal superimposed on the direct current that flows to said main current path.

10. The electronic inductance circuit according to claim 9, comprising a voltage/current conversion circuit connected to said input unit and an alternating current power supply connected to said voltage/current conversion circuit, said alternating current power supply generating an alternating voltage, and said voltage/current conversion circuit converting said alternating voltage to current.

11. The electronic inductance circuit according to claim 1 comprising a current monitoring circuit that is connected to both ends of said first resistor and that detects direct current flowing to said first resistor.

12. The electronic inductance circuit according to claim 1 comprising a switch that is connected in series to said second resistor and that performs a switching operation corresponding to an on/off control signal from outside.

13. The electronic inductance circuit according to claim 1 comprising a choke coil connected in series to said input terminal.

14. An electronic inductance circuit comprising an input terminal, an output terminal, a first inductance circuit unit, a second inductance circuit unit, a current supply circuit, a current source group, and an alternating current power supply unit;

said output terminal and said current supply circuit being connected by an output line via said first inductance circuit unit, and said input terminal and said current supply circuit being connected by an input line via said second inductance circuit unit;

said current supply circuit supplying speech current through said first inductance circuit unit to a subscriber terminal connected between said input terminal and said output terminal while also inputting a speech current flowed out from said subscriber terminal through said second inductance circuit unit;

each of said first and second inductance circuit units comprising a first transistor, a first resistor, a second resistor, a capacitor, and a filter;

a first serial circuit being constructed from a main current path of said first transistor and said first resistor connected in series between said subscriber terminal and said current supply circuit;

a second serial circuit being constructed from said second resistor and said capacitor connected in series between said subscriber terminal and said current supply circuit;

said first serial circuit and said second serial circuit being connected in parallel;

a connection point between said second resistor and said capacitor being connected to the control terminal of said first transistor via said filter;

said current source group comprising a first current source connected to said connection point and a second current source connected to the control terminal of said first transistor;

said first current source generating a current for determining the operating point of said first transistor;

said second current source generating a current of a value that saturates said first transistor corresponding to a stop control signal input from outside; and said alternating current power supply unit comprising a voltage/current conversion circuit connected to a connection point of the control terminal of said first transistor and said filter and an alternating current power supply connected to said voltage/current conversion circuit, said alternating current power supply generating an alternating voltage, and said voltage/current conversion circuit converting said alternating voltage to current.

15. The electronic inductance circuit according to claim 14, wherein said first current source generates a current of a value corresponding to an operating range control signal input from outside, and controls the voltage drop across the main current path of said first transistor.

16. The electronic inductance circuit according to claim 14, wherein the second current source connected to the control terminal of the first transistor that constructs said first inductance circuit unit comprises a second transistor that has a main current path connected between the concerned control terminal and said output line and a third resistor connected between the control terminal of said second transistor and said output line; and a second current source connected to the control terminal of the first transistor that constructs said second inductance circuit unit comprising a third transistor that has a main current path connected between the concerned control terminal and said input line and a fourth resistor connected between the control terminal of said third transistor and said input line.

* * * * *